(12) United States Patent
Najafi et al.

(10) Patent No.: US 12,555,932 B2
(45) Date of Patent: Feb. 17, 2026

(54) METHODS AND DEVICES FOR IMPEDANCE MULTIPLICATION

(71) Applicant: PsiQuantum Corp., Palo Alto, CA (US)

(72) Inventors: Faraz Najafi, San Francisco, CA (US); Qiaodan Jin Stone, Sunnyvale, CA (US)

(73) Assignee: PSIQUANTUM CORP., Palo Alto, CA (US)

(*) Notice: Subject to any disclaimer, the term of this patent is extended or adjusted under 35 U.S.C. 154(b) by 0 days.

(21) Appl. No.: 18/826,038

(22) Filed: Sep. 5, 2024

(65) Prior Publication Data

US 2025/0329948 A1 Oct. 23, 2025

Related U.S. Application Data

(63) Continuation of application No. 17/461,892, filed on Aug. 30, 2021, now Pat. No. 12,107,375, which is a
(Continued)

(51) Int. Cl.
*H01R 4/68* (2006.01)
*G01J 5/00* (2022.01)
(Continued)

(52) U.S. Cl.
CPC .............. *H01R 4/68* (2013.01); *G01J 5/00* (2013.01); *H01B 12/14* (2013.01); *H03K 19/195* (2013.01);
(Continued)

(58) Field of Classification Search
CPC .. H01R 4/68; G01J 5/00; H01B 12/14; H03K 19/195; H10N 60/30; H10N 60/85; H10N 69/00
(Continued)

(56) References Cited

U.S. PATENT DOCUMENTS 3,059,196 A 10/1962 Lentz
3,119,076 A 1/1964 Schlig et al.
(Continued)

FOREIGN PATENT DOCUMENTS

CN 106289515 A 1/2017
CN 106549099 A 3/2017
(Continued)

OTHER PUBLICATIONS

Akhlaghi et al., "Gated Mode145:149 Superconducting Nanowire Single Photon Detectors," Optics Express, vol. 20, No. 2, Jan. 16, 2012, 9 pgs.
(Continued)

*Primary Examiner* — Arnold M Kinkead
(74) *Attorney, Agent, or Firm* — Morgan, Lewis & Bockius LLP

(57) ABSTRACT

An example electric circuit includes a superconducting component having a first terminal and a second terminal, the superconducting component including a first portion, a second portion, and a third portion electrically connecting the first portion with the second portion. The example circuit also includes an electrically-insulating component that thermally couples the first portion with the second portion such that heat produced in response to the first portion transitioning to a non-superconducting state is transferred through the electrically-insulating component to the second portion. The example circuit further includes an input component coupled to the first portion, the input component configured to supply an input to the first portion, and an output component coupled to the second terminal of the superconducting component, the output component configured to be responsive to a voltage drop across the superconducting component.

20 Claims, 30 Drawing Sheets

Related U.S. Application Data continuation of application No. 16/664,716, filed on Oct. 25, 2019, now Pat. No. 11,108,172, which is a continuation of application No. 16/136,124, filed on Sep. 19, 2018, now Pat. No. 10,461,445.

(60) Provisional application No. 62/632,323, filed on Feb. 19, 2018, provisional application No. 62/630,657, filed on Feb. 14, 2018, provisional application No. 62/585,436, filed on Nov. 13, 2017.

(51) Int. Cl.
    *H01B 12/14*     (2006.01)
    *H03K 19/195*    (2006.01)
    *H10N 60/30*     (2023.01)
    *H10N 60/85*     (2023.01)
    *H10N 69/00*     (2023.01)

(52) U.S. Cl.
    CPC ............. *H10N 60/30* (2023.02); *H10N 60/85* (2023.02); *H10N 69/00* (2023.02)

(58) Field of Classification Search
    USPC ..... 326/1; 365/148; 250/227.11, 214.1, 395, 250/371, 336.2; 505/160; 977/954
    See application file for complete search history.

(56) References Cited

U.S. PATENT DOCUMENTS

| | | |
|---|---|---|
| 3,283,282 A | 11/1966 | Rosenberg |
| 4,336,561 A | 6/1982 | Murphy |
| 4,365,317 A | 12/1982 | Gheewala |
| 4,509,146 A | 4/1985 | Wang et al. |
| 4,647,954 A | 3/1987 | Graf et al. |
| 4,904,869 A | 2/1990 | Schneider |
| 4,989,051 A | 1/1991 | Whitehead et al. |
| 5,006,705 A | 4/1991 | Saito et al. |
| 5,026,682 A | 6/1991 | Clark et al. |
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,053,383 A | 10/1991 | Short et al. |
| 5,127,928 A | 7/1992 | Farries et al. |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A | 5/1996 | Frazier |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 6,900,714 B1 | 5/2005 | Huang et al. |
| 7,227,438 B2 | 6/2007 | Song et al. |
| 7,513,765 B2 | 4/2009 | Liao |
| 7,558,030 B2 | 7/2009 | Lee et al. |
| 7,589,323 B2 | 9/2009 | Tanaka et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,240,539 B2 | 1/2016 | Nam et al. |
| 9,293,240 B2 | 3/2016 | Kroulik |
| 9,443,576 B1 | 9/2016 | Miller |
| 9,500,519 B2 | 11/2016 | Tang et al. |
| 9,509,315 B2 | 11/2016 | McCaughan et al. |
| 9,853,645 B1 | 12/2017 | Mukhanov et al. |
| 9,876,505 B1 | 1/2018 | Dai et al. |
| 9,954,158 B2 | 4/2018 | You et al. |
| 9,998,122 B2 | 6/2018 | Hamilton et al. |
| 10,103,736 B1 | 10/2018 | Powell et al. |
| 10,133,986 B1 | 11/2018 | Newton et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,454,016 B2 | 10/2019 | Fong et al. |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 10,879,905 B2 | 12/2020 | Najafi et al. |
| 10,897,235 B2 | 1/2021 | Najafi et al. |
| 10,911,031 B2 | 2/2021 | Wise et al. |
| 10,944,403 B2 | 3/2021 | Najafi |
| 10,984,857 B2 | 4/2021 | Najafi |
| 11,009,387 B2 | 5/2021 | Chung et al. |
| 11,313,719 B2 | 4/2022 | Najafi et al. |
| 11,473,974 B2 | 10/2022 | Thompson et al. |
| 11,629,995 B2 | 4/2023 | Najafi et al. |
| 2002/0110328 A1 | 8/2002 | Bischel et al. |
| 2002/0149453 A1 | 10/2002 | Snitchler et al. |
| 2003/0087503 A1 | 5/2003 | Sakaguchi et al. |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0183327 A1 | 8/2006 | Moon |
| 2006/0270224 A1 | 11/2006 | Song et al. |
| 2008/0026234 A1 | 1/2008 | Sambasivan et al. |
| 2008/0197285 A1 | 8/2008 | Frey et al. |
| 2008/0272302 A1 | 11/2008 | Frey et al. |
| 2009/0014433 A1 | 1/2009 | O'Neil et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0116742 A1 | 5/2011 | Chang et al. |
| 2011/0254053 A1 | 10/2011 | Goupil et al. |
| 2013/0012392 A1 | 1/2013 | Tanaka et al. |
| 2013/0090244 A1 | 4/2013 | Shinzato et al. |
| 2013/0124112 A1 | 5/2013 | Heath et al. |
| 2013/0143744 A1 | 6/2013 | Marsili et al. |
| 2013/0150247 A1 | 6/2013 | Reeves et al. |
| 2013/0281302 A1* | 10/2013 | Mottonen ............... B82Y 10/00 250/371 |
| 2013/0341594 A1 | 12/2013 | Mohseni et al. |
| 2014/0103196 A1 | 4/2014 | Soga et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2016/0028403 A1 | 1/2016 | McCaughan et al. |
| 2016/0356708 A1 | 12/2016 | Bennett et al. |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |
| 2018/0335343 A1 | 11/2018 | Najafi et al. |
| 2018/0364097 A1 | 12/2018 | Najafi |
| 2018/0374979 A1 | 12/2018 | Nozawa |
| 2019/0027672 A1 | 1/2019 | Megrant |
| 2019/0035904 A1 | 1/2019 | Najafi |

(56) References Cited

U.S. PATENT DOCUMENTS

| | | |
|---|---|---|
| 2019/0035999 A1 | 1/2019 | Najafi |
| 2019/0044051 A1 | 2/2019 | Caudillo et al. |
| 2019/0109595 A1 | 4/2019 | Najafi |
| 2019/0148848 A1 | 5/2019 | Najafi et al. |
| 2019/0227230 A1 | 7/2019 | Novack et al. |
| 2019/0288132 A1 | 9/2019 | Wang et al. |
| 2019/0378874 A1 | 12/2019 | Rosenblatt et al. |
| 2020/0027502 A1 | 1/2020 | Berggren et al. |
| 2020/0066962 A1 | 2/2020 | Najafi |
| 2020/0080890 A1 | 3/2020 | Najafi et al. |
| 2020/0111944 A1 | 4/2020 | Moodera et al. |
| 2020/0176662 A1 | 6/2020 | Dayton et al. |
| 2020/0194656 A1 | 6/2020 | Najafi |
| 2020/0256722 A1 | 8/2020 | Najafi et al. |
| 2021/0119102 A1 | 4/2021 | Zhu et al. |
| 2021/0183767 A1 | 6/2021 | Najafi et al. |
| 2021/0239518 A1 | 8/2021 | Chung et al. |
| 2021/0384878 A1 | 12/2021 | Najafi et al. |
| 2023/0175887 A1 | 6/2023 | Najafi et al. |
| 2023/0213380 A1 | 7/2023 | Thompson et al. |
| 2024/0334846 A1 | 10/2024 | Najafi |
| 2024/0339978 A1 | 10/2024 | Najafi et al. |
| 2024/0369408 A1 | 11/2024 | Thompson et al. |
| 2024/0402004 A1 | 12/2024 | Chung et al. |
| 2024/0410749 A1 | 12/2024 | Najafi et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO2012052628 A2 | 4/2012 |

OTHER PUBLICATIONS

Atikian, Haig A. et al., "Superconducting Nanowire Single Photon Detector on Diamond," arXiv: 1401.4490v1, physics.optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-No. resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.

Murphy et al., "Nanoscale superconducting memory based on the kinetic inductance of asymmetric nanowire loops," Department of Physics, University of Illinois at Urbana- Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, 17 pgs.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AIN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

McCaughan, A.N., et al., "Using Geometry to Sense Current," Nano Letters 16 (2016), 6 pgs.

Saraswat et al., "Highly oriented, free-standing, superconducting NbN films growth on chemical vapor deposited graphene," APL Materials 2, 056103 (2014); https://doi.org/10.1063/1.4875356 (Year: 2014), 7 pgs.

Stanfield, CMOS-Compatible, Piezo-Optomechanically Tunable Photonics for Visible Wavelengths and Cryogenic Temperatures, vol. 27, Issue 20, pp. 28588-28605, 2019, 18 pgs.

D. Sahin et al., "Waveguide photon-number-resolving detectors for quantum photonic integrated circuits", Appl. Phys. Lett., vol. 103, No. 11, p. 111116, Sep. 2013, 16 pgs.

Sergio Pagano et al., "Nano-Strip Three-Terminal Superconducting Device for Cryogenic Detector Readout", IEEE Transactions on Applied Superconductivity, vol. 21, No. 3, Jun. 2011, 4 pgs.

PsiQuantum Corp., International Search Report and Written Opinion, PCT/US2018/033042, Aug. 28, 2018, 13 pgs.

PsiQuantum Corp., International Search Report and Written Opinion, PCT/US2018/033041, Jul. 27, 2018, 16 pgs.

PsiQuantum Corp., International Search Report and Written Opinion, PCT/US2018/044091, Nov. 7, 2018, 12 pgs.

PsiQuantum Corp., Invitation to Pay Additional Fees/Partial Search Report, PCT/US2018/037892, Aug. 20, 2018, 12 pgs.

PsiQuantum Corp., Invitation to Pay Additional Fees/Partial Search Report, PCT/US2018/054414, Jan. 24, 2019, 21 pgs.

PsiQuantum Corp., International Search Report and Written Opinion, PCT/US2018/054414, Mar. 20, 2019, 21 pgs.

Najafi, Non-Final Office Action, U.S. Appl. No. 16/028,288, filed Dec. 12, 2018, 6 pgs.

Najafi, Notice of Allowance dated Apr. 5, 2019, U.S. Appl. No. 16/028,288, 10 pgs.

Najafi, Non-Final Office Action, U.S. Appl. No. 16/028,293, filed Sep. 21, 2018, 8 pgs.

Najafi, Final Office Action, U.S. Appl. No. 16/028,293, filed Mar. 1, 2019, 5 pgs.

Najafi, Notice of Allowance, U.S. Appl. No. 16/012,520, filed Sep. 21, 2018, 9 pgs.

Najafi, Non-Final Office Action, U.S. Appl. No. 16/136,124, filed Apr. 4, 2019, 9 pgs.

Najafi, Quayle Office Action, U.S. Appl. No. 16/151,180, filed Jan. 31, 2019, 5 pgs.

Najafi, Notice of Allowance, U.S. Appl. No. 16/151,180, filed Mar. 14, 2019, 5 pgs.

(56) References Cited

OTHER PUBLICATIONS

Najafi, Notice of Allowance, U.S. Appl. No. 16/151,190, filed Feb. 6, 2019, 11 pgs.
Najafi, Notice of Allowance, U.S. Appl. No. 16/151,190, filed Mar. 28, 2019, 5 pgs.
Najafi, Non-Office Action, U.S. Appl. No. 16/046,815, filed Feb. 4, 2019, 9 pgs.
Najafi, Notice of Allowance, U.S. Appl. No. 16/046,815, filed Oct. 7, 2019, 9 pgs.
Najafi, Non-Office Action, U.S. Appl. No. 16/046,807, filed Mar. 18, 2019, 10 pgs.
Najafi, Non-Office Action, U.S. Appl. No. 16/107,143, filed Mar. 19, 2019, 11 pgs.
Psiquantum Corp., International Search Report and Written Opinion, PCT/US2019/017687, Apr. 30, 2019, 13 pgs.
PSIQUANTUM Corp., International Search Report and Written Opinion, PCT/US2019/017691, Apr. 23, 2019, 7 pgs.
PSIQUANTUM Corp., International Preliminary Report on Patentability, PCT/US2019/017691, Aug. 18, 2020, 5 pgs.
PSIQUANTUM Corp., International Search Report and Written Opinion, PCT/US2019/030019, Jul. 17, 2019, 12 pgs.
PSIQUANTUM Corp., International Preliminary Report on Patentability, PCT/US2018/044091, Jan. 28, 2020, 6 pgs.
Najafi, Non-Final Office Action, U.S. Appl. No. 16/664,716, Apr. 1, 2020, 15 pgs.
Psiquantum, International Search Report and Written Opinion, PCT/US2019/051853, Jan. 27, 2020, 13 pgs.
Psiquantum, International Preliminary Report on Patentability, PCT/US2018/033041, Nov. 26, 2019, 8 pgs.
Psiquantum, International Preliminary Report on Patentability, PCT/US2018/054414, Apr. 8, 2020, 15 pgs.
Psiquantum, International Search Report and Written Opinion, PCT/US2018/037892, Oct. 17, 2018, 19 pgs.
Psiquantum, International Preliminary Report on Patentability, PCT/US2018/037892, Dec. 17, 2019, 12 pgs.
Najafi, Non-Final Office Action, U.S. Appl. No. 16/553,068, filed Apr. 1, 2020, 12 pgs.
Najafi, Non-Final Office Action, U.S. Appl. No. 16/544,718, filed Aug. 17, 2020, 7 pgs.
Najafi, Non-Final Office Action, U.S. Appl. No. 16/656,506, filed Aug. 13, 2020, 19 pgs.
Najafi, Notice of Allowance, U.S. Appl. No. 16/553,068, filed Sep. 18, 2020, 9 pgs.
Najafi, Notice of Allowance, U.S. Appl. No. 16/473,550, filed Sep. 24, 2020, 9 pgs.
Najafi, Notice of Allowance, U.S. Appl. No. 16/656,506, filed Nov. 3, 2020, 13 pgs.
Najafi, Final Office Action, U.S. Appl. No. 16/664,716, filed Oct. 16, 2020, 14 pgs.
Najafi, Notice of Allowance, U.S. Appl. No. 16/473,547, filed Dec. 9, 2020, 9 pgs.
Najafi, Notice of Allowance, U.S. Appl. No. 16/543,256, filed Dec. 9, 2020, 13 pgs.
Chung, Non-Final Office Action, U.S. Appl. No. 16/849,829, filed Aug. 21, 2020, 7 pgs.
Chung, Notice of Allowance, U.S. Appl. No. 16/849,829, filed Dec. 8, 2020, 5 pgs.
PSIQUANTUM Corp., International Search Report and Written Opinion, PCT/US2020/028519, Jan. 12, 2021, 9 pgs.
PSIQUANTUM Corp., Notice of Allowance, U.S. Appl. No. 16/849,829, filed Mar. 1, 2021, 8 pgs.
PSIQUANTUM Corp., Notice of Allowance, U.S. Appl. No. 16/544,718, filed Feb. 5, 2021, 6 pgs.
Najafi, Notice of Allowance, U.S. Appl. No. 16/664,716, filed Jan. 28, 2021, 8 pgs.
PSIQUANTUM, Notice of Allowance, U.S. Appl. No. 16/840,166, filed Mar. 23, 2021, 8 pgs.
Najafi, Notice of Allowance, U.S. Appl. No. 16/664,716, filed Apr. 21, 2021, 8 pgs.
Psiquantum, Corrected Notice of Allowance, U.S. Appl. No. 16/543,256, filed Mar. 24, 2021, 2 pgs.
Psiquantum, Notice of Allowance, U.S. Appl. No. 16/575,274, filed Apr. 22, 2021, 11 pgs.
Psiquantum, International Preliminary Report on Patentability, PCT/US2018/033042, Nov. 19, 2019, 7 pgs.
Psiquantum, International Preliminary Report on Patentability, PCT/US2019/051853, Mar. 23, 2021, 10 pgs.
Psiquantum, International Preliminary Report on Patentability, PCT/US2019/017687, Aug. 18, 2020, 6 pgs.
Psiquantum, International Preliminary Report on Patentability, PCT/US2019/030019, Nov. 3, 2020, 7 pgs.
Psiquantum, Notice of Allowance, U.S. Appl. No. 16/840,166, filed May 24, 2021, 5 pgs.
Najafi, Non-Final Office Action, U.S. Appl. No. 17/135,861, filed Sep. 23, 2021, 7 pgs.
Psiquantum, International Preliminary Report on Patentability, PCT/US2019/016885, Aug. 11, 2020, 7 pgs.
Psiquantum, International Search Report and Written Opinion, PCT/US2019/016885, Apr. 24, 2019, 9 pgs.
Thompson, Non-Final Office Action, U.S. Appl. No. 16/450,911, Aug. 2, 2019, 7 pgs.
Thompson, Notice of Allowance, U.S. Appl. No. 16/450,911, filed Dec. 11, 2019, 5 pgs.
Thompson, Non-Final Office Action, U.S. Appl. No. 16/985,137, filed Sep. 30, 2021, 7 pgs.
Thompson, Notice of Allowance, U.S. Appl. No. 16/985,137, filed May 26, 2022, 9 pgs.
Najafi, Notice of Allowance, U.S. Appl. No. 16/046,807, filed Oct. 29, 2019, 8 pgs.
Najafi, Notice of Allowance, U.S. Appl. No. 16/136,124, filed Jun. 27, 2019, 8 pgs.
PSIQUANTUM Corp., International Search Report and Written Opinion, PCT/US2018/060802, Apr. 8, 2019, 18 pgs.
Psiquantum, International Preliminary Report on Patentability, PCT/US2018/060802, May 19, 2020, 13 pgs.
Najafi, Notice of Allowance, U.S. Appl. No. 16/773,921, filed Sep. 22, 2021, 9 pgs.
Najafi, Notice of Allowance, U.S. Appl. No. 17/195,522, filed Nov. 12, 2021, 9 pgs.
Najafi, Notice of Allowance, U.S. Appl. No. 16/773,921, filed Nov. 15, 2021, 9 pgs.
Najafi, Notice of Allowance, U.S. Appl. No. 17/033,337, filed Dec. 9, 2021, 9 pgs.
Chung, Non-Final Office Action, U.S. Appl. No. 17/232,086, filed Dec. 16, 2021, 14 pgs.
Chung, Notice of Allowance, U.S. Appl. No. 17/232,086, filed May 11, 2022, 6 pgs.
Najafi, Notice of Allowance, U.S. Appl. No. 17/135,861, filed Jan. 28, 2022, 7 pgs.
Thompson, Non-Final Office Action, U.S. Appl. No. 16/985,137, filed Jan. 18, 2022, 8 pgs.
Najafi, Notice of Allowance, U.S. Appl. No. 16/623,503, filed Feb. 22, 2022, 11 pgs.
Najafi, Non-Final Office Action, U.S. Appl. No. 16/813,628, filed Mar. 7, 2022, 8 pgs.
Najafi, Final Office Action, U.S. Appl. No. 16/813,628, filed Aug. 29, 2022, 9 pgs.
Najafi, Non-Final Office Action, U.S. Appl. No. 16/813,628, Dec. 6, 2022, 8 pgs.
Najafi, Notice of Allowance, U.S. Appl. No. 16/813,628, filed Jun. 28, 2023, 8 pgs.
Najafi, Notice of Allowance, U.S. Appl. No. 18/103,413, Jul. 18, 2023, 9 pgs.
Najafi, Non-Final Office Action, U.S. Appl. No. 18/103,413, filed Nov. 7, 2023, 7 pgs.
Najafi, Non-Final Office Action, U.S. Appl. No. 17/150,889, filed Sep. 14, 2023, 9 pgs.
Najafi, Notice of Allowance, U.S. Appl. No. 17/160,283, filed Nov. 2, 2022, 9 pgs.
Najafi, Non-Final Office Action, U.S. Appl. No. 17/160,283, filed Jul. 15, 2022, 15 pgs.

(56) References Cited

OTHER PUBLICATIONS

Najafi, Non-Final Office Action, U.S. Appl. No. 17/160,283, filed Mar. 31, 2022, 18 pgs.
Najafi, Non-Final Office Action, U.S. Appl. No. 17/234,701, filed Feb. 1, 2022, 14 pgs.
Najafi, Notice of Allowance, U.S. Appl. No. 17/234,701, filed Jun. 6, 2022, 9 pgs.
Najafi, Non-Final Office Action, U.S. Appl. No. 16/840,182, filed Apr. 29, 2022, 13 pgs.
Najafi, Notice of Allowance, U.S. Appl. No. 16/840,182, Sep. 22, 2022, 10 pgs.
Najafi, Non-Final Office Action, U.S. Appl. No. 17/967,773, filed Oct. 20, 2023, 10 pgs.
Najafi, Non-Final Office Action, U.S. Appl. No. 17/098,235, filed Oct. 20, 2023, 16 pgs.
Najafi, Notice of Allowance, U.S. Appl. No. 18/103,413, filed Jan. 18, 2024, 8 pgs.
Najafi, Final Office Action, U.S. Appl. No. 17/967,773, filed Jan. 18, 2024, 12 pgs.
Najafi, Notice of Allowance, U.S. Appl. No. 17/098,235, filed Jan. 24, 2024, 5 pgs.
Najafi, Notice of Allowance, U.S. Appl. No. 17/150,889, filed Feb. 5, 2024, 8 pgs.
Najafi, Notice of Allowance, U.S. Appl. No. 17/967,773, filed Apr. 15, 2024, 7 pgs.
Najafi et al., Notice of Allowance, U.S. Appl. No. 17/461,892, Jun. 7, 2024, 8 pgs.
Najafi et al., Non-Final Office Action, U.S. Appl. No. 18/639,722, filed Nov. 4, 2024, 24 pgs.

* cited by examiner

METHODS AND DEVICES FOR IMPEDANCE MULTIPLICATION

PRIORITY AND RELATED APPLICATIONS

This application is a continuation of U.S. application Ser. No. 17/461,892, filed Aug. 30, 2021, which is a continuation of U.S. application Ser. No. 16/664,716, filed Oct. 25, 2019, now U.S. Pat. No. 11,108,172, which is a continuation of U.S. application Ser. No. 16/136,124, filed Sep. 19, 2018, now U.S. Pat. No. 10,461,445, which claims priority to U.S. Provisional Application No. 62/632,323, filed Feb. 19, 2018, entitled "Superconducting Logic Components," U.S. Provisional Application No. 62/630,657, filed Feb. 14, 2018, entitled "Superconducting Logic Gate," and U.S. Provisional Application No. 62/585,436, filed Nov. 13, 2017, entitled "Methods and Devices for Impedance Multiplication," each of which is hereby incorporated by reference in its entirety.

TECHNICAL FIELD

This relates generally to superconducting devices, including but not limited to, superconductor-based impedance multiplication devices.

BACKGROUND

Impedance is a measure of the opposition to current flow in an electrical circuit. Impedance multiplication allows a small current to produce a high impedance. A high impedance can be useful in many applications, such as in voltage dividers and reducing load on input signals.

Superconductors are materials capable of operating in a superconducting state with zero electrical resistance under particular conditions. Additionally, in some circumstances, superconductors have high electrical resistance while in a non-superconducting state. Moreover, the superconductors generate heat when operating in a non-superconducting state, and when transitioning from a superconducting state to a non-superconducting state in some circumstances.

SUMMARY

There is a need for systems and/or devices with more efficient and effective methods for generating high impedance values. Such systems, devices, and methods optionally complement or replace conventional systems, devices, and methods for generating high impedance values.

In one aspect, some embodiments include an electric circuit having: (1) a first superconducting component having a first terminal, a second terminal, and a constriction region between the first terminal and the second terminal; (2) a second superconducting component having a third terminal and a fourth terminal; and (3) a first electrically-insulating component that thermally couples the first superconducting component and the second superconducting component such that heat produced at the constriction region is transferred through the first component to the second superconducting component.

In another aspect, some embodiments include a method of cascaded impedance multiplication. The method includes: (1) supplying a first current to a first superconducting component such that the first superconducting component is in a superconducting state; (2) supplying a second current to a second superconducting component having a constriction region; (3) in response to supplying the second current, transitioning the constriction region from a superconducting state to a non-superconducting state; (4) transferring resistive heat generated at the constriction region while in the non-superconducting state to the first superconducting component; and (5) in response to transferring the resistive heat, transitioning the first superconducting component to the non-superconducting state.

In another aspect, some embodiments include an electric circuit having a first superconducting component including: (a) a first terminal; (b) a second terminal; (c) a first portion between the first terminal and the second terminal, the first portion having a first superconducting current threshold; and (d) a second portion between the first terminal and the second terminal, the second portion having a second superconducting current threshold, less than the first superconducting current threshold; where the first portion is positioned in proximity to the second portion such that resistive heat from the second portion is transferred to the first portion.

In yet another aspect, some embodiments include a method of fabricating a superconducting device including: (1) providing a thin film of superconducting material; (2) patterning the thin film to produce a first superconducting component and a second superconducting component; and (3) providing an electrically-insulating component thermally coupling the first superconducting component and the second superconducting component, where the second superconducting component includes a constriction region adjacent to the electrically-insulating component.

In yet another aspect, some embodiments include a superconductor circuit configured to perform any of the methods described herein.

Thus, devices and circuits are provided with methods for fabricating and operating superconductor components, thereby increasing the effectiveness, efficiency, and user satisfaction with such circuits and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
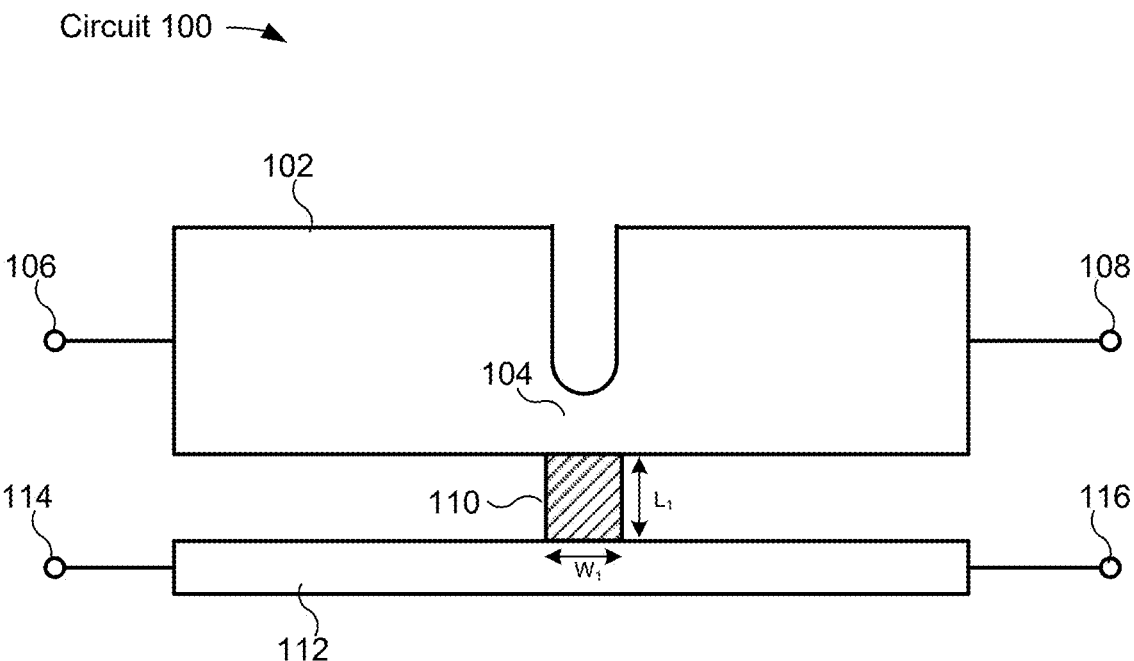
FIGS. 1A-1C are block diagrams illustrating representative circuits in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

The present disclosure includes descriptions of circuits and devices for impedance amplification. In accordance with some embodiments, impedance amplification is achieved by positioning two superconductors in proximity to one another such that there is no, or negligible, electrical (and quantum) coupling between the two superconductors, but there is thermal coupling between the two superconductors. In accordance with some embodiments, impedance amplification is achieved by positioning a normal conductor (e.g. made from a metal or any other resistive material) non-superconductor in proximity to a superconductor such that there is no, or negligible, electrical (and quantum) coupling between the normal conductor and the superconductor, but there is thermal coupling between the two. Moreover, for embodiments having two superconductors, one of the superconductors is configured so that a small input current will cause a portion of the superconductor to transition to a non-superconducting state. The transition to the non-superconducting state is accompanied by heat generation due to the resistance of the superconductor increasing when it is in the non-superconducting state. In this example, the generated heat is transferred to the second superconductor and, together with an input current applied to the second superconductor, causes the second superconductor to transition to the non-superconducting state. Moreover, in this example, the second superconductor is configured such that the non-superconducting region of the second superconductor spreads and becomes significantly larger in size than the non-superconducting portion of the first superconductor. In this way, the impedance in the second superconductor is triggered by the small input current on the first superconductor yet is significantly larger than the impedance of the first superconductor. In other examples, the transition to the non-superconducting state of the second superconductor can be driven by heat generation that can result from a current flowing through a first non-superconducting material (e.g., a normal metal or any other resistive material).

Figure 12:
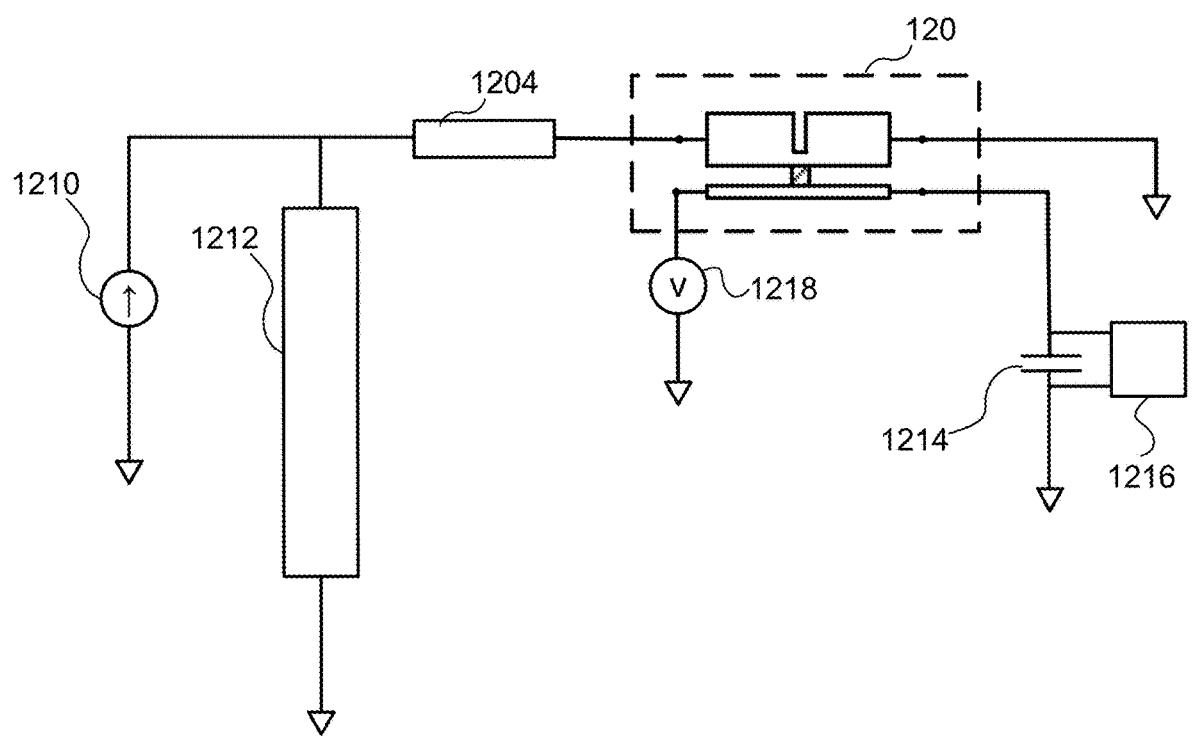
FIG. 12 is a block diagram illustrating a detection circuit including the circuit of FIG. 1B in accordance with some embodiments.

In some embodiments, the small input current is provided by a photodetector component (e.g., as illustrated in FIG. 12) or a qubit component. In some embodiments, the qubit component includes a transmon qubit device, an Xmon qubit device, and/or a Josephson junction device. In some embodiments, the qubit component is coupled to the first superconductor component via a coupling circuit (e.g., resonator circuit).

Figure 1B:
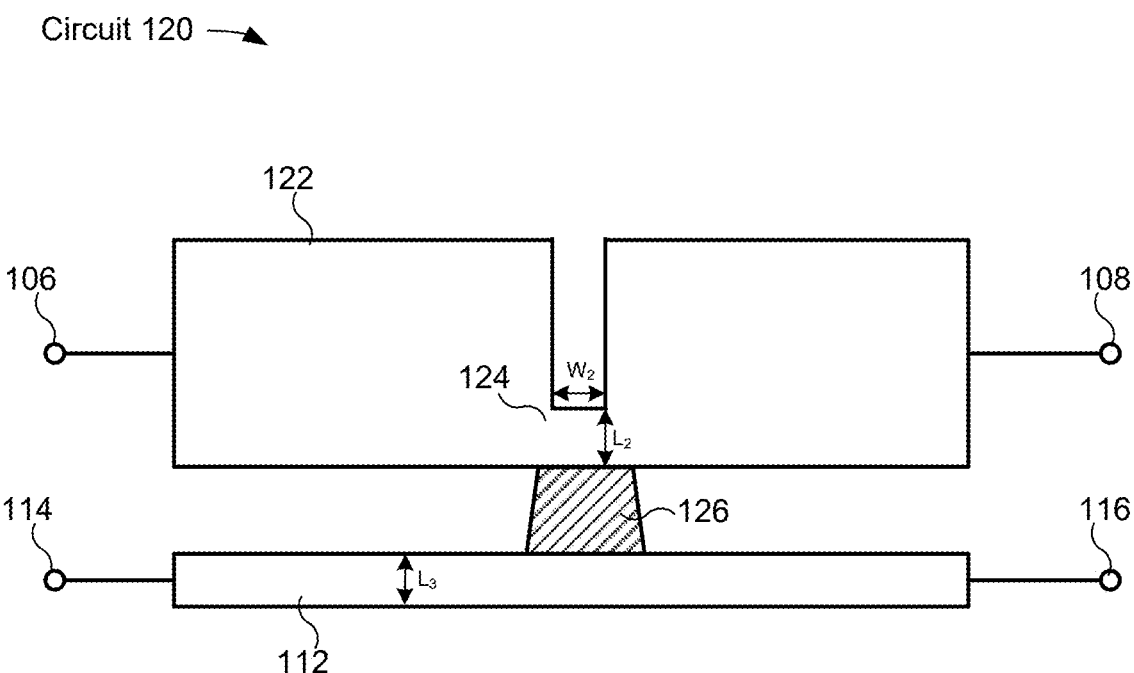

FIGS. 1A-1B are block diagrams illustrating representative circuits in accordance with some embodiments. FIG. 1A shows circuit 100 having superconducting component 102 and superconducting component 112. FIG. 1A further shows terminals 106 and 108 connected to superconducting component 102 and terminals 114 and 116 connected to superconducting component 112. Superconducting component 102 includes constriction region 104 adjacent to coupling component 110, which thermally-couples superconducting components 102 and 112. In some embodiments, the superconducting component 102 is replaced with a non-superconducting component, e.g., a resistive component formed from a metal material, a semiconducting material or any other resistive material. In some embodiments, the coupling component 110 is composed of a thermally-conductive, electrically-insulating material. In some embodiments, the coupling component 110 is composed of a same material as the superconducting components 102 and 112, but is sized such that it operates in an insulating state rather than a superconducting state. In some embodiments in which the coupling component 110 is composed of a potentially-superconducting material, the coupling component 100 has a width, denoted $W_1$, in the range of 5 nanometers (nm) to 20 nm. In some embodiments, the coupling component 110 is on a distinct plane from the superconducting components 102 and 112 (e.g., as illustrated in FIG. 13B). In some embodiments, the coupling component 110 is composed of a dielectric material. In some embodiments in which the coupling component 110 is composed of a non-superconducting material, the coupling component 100 has a width, denoted $W_1$, in the range of 5 nm to 100 nm. In some embodiments, the coupling component 100 has a length, denoted $L_1$, long enough so as to inhibit tunneling effects between the components 102 and 112 and short enough so as to be less than a photon's mean free path (e.g., in the range of 5 nm to 1 micron).

FIG. 1B shows circuit 120 having superconducting component 122 and superconducting component 112. FIG. 1B further shows terminals 106 and 108 connected to superconducting component 122 and terminals 114 and 116 connected to superconducting component 112. Superconducting component 122 includes constriction region 124 adjacent to coupling component 126, which thermally-couples superconducting components 122 and 112. Circuit 120 is similar to circuit 100 in FIG. 1A, except that the shapes of the respective constriction regions and coupling components differ. In some embodiments, the constriction regions 124 and 104 have a width, denoted $W_2$, large enough to be able to operate in the superconducting state (e.g., greater than 10 nm) and minimized to reduce power consumption of the circuit (e.g., a width in the range of 10 nm to 200 nm). In some embodiments, the constriction regions 124 and 104 have a length, denoted $L_2$, large enough to be able to operate in the superconducting state (e.g., greater than 10 nm) and minimized to reduce power consumption of the circuit (e.g., a length in the range of 10 nm to 200 nm). In some embodiments, the adjacent portions of the superconducting components 102 and 122 are sized to facilitate heat dissipation from the constriction region (e.g., 5, 10, or 20 times as large as the constriction region). In some embodiments, the superconducting component 112 has a length, denoted $L_3$, in the range of 10 nm to 200 nm.

The shapes of the superconducting components, constriction regions, and coupling components shown in FIGS. 1A-1B are intended as non-limiting examples. As one skilled in the art would recognize after reading the instant application, other geometric and irregular shapes could be used.

Figure 1C:
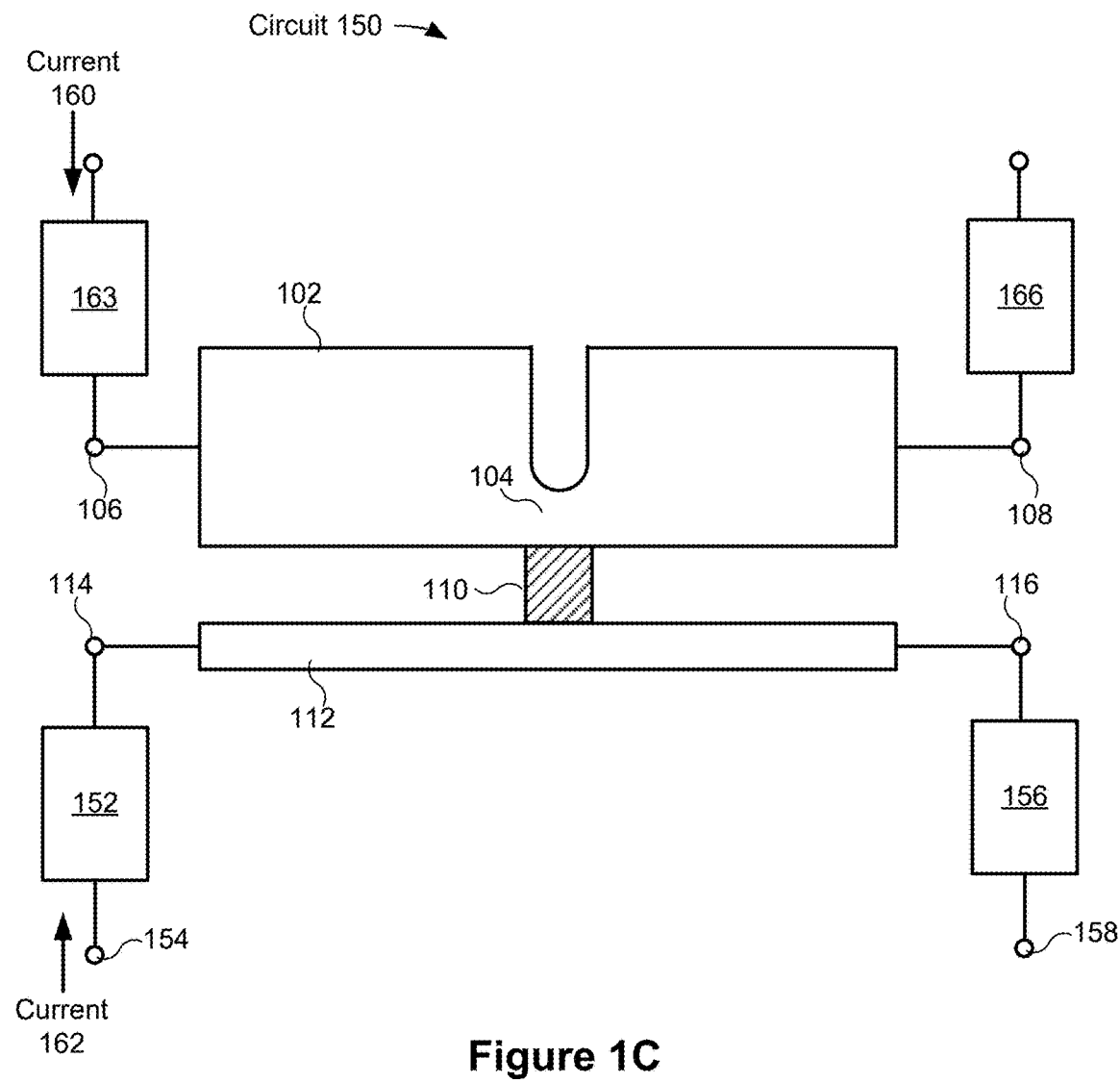

FIG. 1C shows circuit 150 having superconducting components 102 and 112 (as illustrated in FIG. 1A) with components 152 and 156 coupled to terminals 114 and 116 respectively, and with components 163 and 166 coupled to terminals 106 and 108 respectively. In this example, terminals 106 and 108 can be understood to be respective gate terminals and terminals 114 and 116 can be understood to be drain and source terminals. In some embodiments, various components can be coupled to terminals 106, 108, 114, and 116 in many different configurations: components can be coupled to terminals 106 and/or 108 in addition to, or instead of, being coupled to terminals 114 and 116; the circuit can also be configured with a resistive component, e.g., a resistor on terminals 106 and/or 108; the circuit can be configured with a resistive component, on terminals 106 and/or 108, and with an inductor on terminal 114; the circuit can be configured with a resistive component, on terminals 106 and/or 108 and with an inductor on terminal 116; the circuit can be configured with at least one inductor on terminal 114 or terminal 116; and the circuit can be configured with any combination of resistors and inductors on terminals 106 and/or 108 in combination with either an inductor on terminal 114 or terminal 116. One of ordinary skill in the art having the benefit of this disclosure will appreciated that many other configurations of components on the terminal 106, 108, 114, and 116 are possible without departing from the scope of the present disclosure.

FIG. 1C further shows current 162 (e.g., a drain-source current) supplied to superconducting component 112 and current 160 (e.g., a gate current) supplied to superconducting component 102. Table 1 below illustrates examples of components 152 and 156 in accordance with some embodiments.

TABLE 1

Example Components and Relative Currents

| Component 152 | Component 156 | Current 160 | Current 162 |
|---|---|---|---|
| None | None | Higher | Lower |
| Resistor | Inductor | Lower | Low-to-High |
| Inductor | Inductor | Lower | Lower |
| Resistor | None | Higher | Lower |
| None | Inductor | Lower | Low-to-High |

In accordance with some embodiments, the components 152 and 156 in Table 1 are interchangeable based on the circuitry coupled via terminal 154 and 158. Adding a resistor to the circuit 150 (e.g., as component 163) allows for control of current flow in some embodiments. For example, if a current source is coupled such that the resistor and a superconductor are in parallel with one another (e.g., resistor 1204 and photodetector 1212 in FIG. 12), the current from the current source will flow through the superconductor while it is in the superconducting state and will be redirected (or, at least a large portion of the current will be redirected) through the resistor (and, optionally, from the resistor to a superconducting component in circuit 120) while the superconductor is in the non-superconducting state. In some embodiments, adding an inductor to the circuit 150 (e.g., as component 152 and/or component 156) prevents latch-up of the component 112 and allows for more current 162 to be supplied to the superconducting component 112 and less current 160 to be supplied to the superconducting component 102, relative to a case where an inductor is not present.

Table 2, below, shows advantages and disadvantages of relative currents of Table 1 in accordance with some embodiments. As shown in Table 2, reducing the current 160 supplied to the superconductor 102 increases sensitivity (e.g., the superconductor 102 operates closer to a superconducting current threshold while in the non-superconducting state) and lowers power consumption in accordance with some embodiments. As also shown in Table 2, reducing the current 162 supplied to the superconductor 112 increases switching speed, but also reduces a signal-to-noise ratio in accordance with some embodiments. As one of skill in the art would recognize after reading the present disclosure, in some applications it would be more beneficial to have a high current 162, while in other applications it would be more beneficial to have a lower current 162.

TABLE 2

Advantages and Disadvantages of Relative Amounts of Current

| | Current 162 | Current 160 |
|---|---|---|
| Lower | Higher speed<br>Lower Signal-to-Noise Ratio | Higher Sensitivity<br>Lower Power Consumption |
| Higher | Higher Signal-to-Noise Ratio<br>Lower Speed | Higher Speed<br>Higher Power Consumption |

Figure 1D:
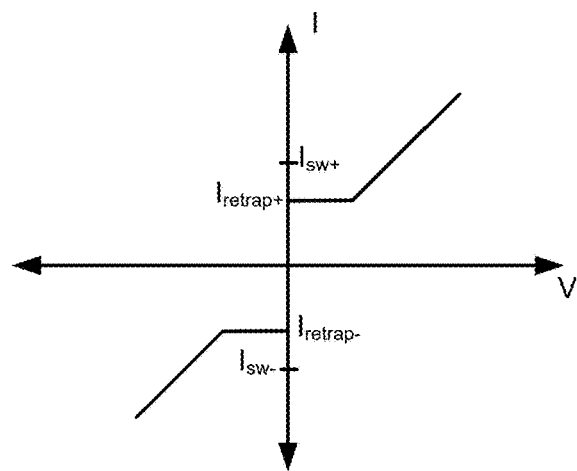
FIG. 1D is a prophetic graph of current and voltage for a representative superconducting component in accordance with some embodiments.

FIG. 1D shows a prophetic graph of current and voltage of the superconducting component 112 in accordance with some embodiments. As shown in FIG. 1D, while the current supplied to the superconductor 112 (e.g., current 162) is between $I_{retrap-}$ and $I_{retrap+}$ the superconductor 112 operates in the superconducting state with no voltage drop. While current supplied to the superconductor 112 is above $I_{sw+}$, or below $I_{sw-}$, the superconductor 112 operates in the non-superconducting (conducting) state. While a current supplied to the superconductor 112 is between the switching current and the corresponding retrapping current, e.g., between $I_{sw+}$ and $I_{retrap+}$ or between $I_{sw-}$ and $I_{retrap-}$, the superconductor 112 maintains its prior state. For example, if the superconductor 112 was in the superconducting state, it will stay in the superconducting state. Likewise, if the superconductor 112 was in the non-superconducting state, it will stay in the non-superconducting state (e.g., due to insufficient self-cooling of the superconductor 112).

Supplying a current 162 in excess of the switching current (e.g., above $I_{sw+}$) causes the superconductor 112 to latch in the non-superconducting state (stay in the non-superconducting state until the current 162 is removed or reduced) in accordance with some embodiments. Adding an inductor (e.g., as component 152 and/or component 156) prevents the latching effect (e.g., allows the superconductor 112 to transition back to the superconducting state) in accordance with some embodiments. A transition time of the superconductor 112 is based on the inductance of the inductor (e.g., the time constant $\tau$ is equal to the ratio of inductance to resistance) in accordance with some embodiments. For example, the transition time is optionally in the range of 50 picoseconds (ps) to 200 ps.

Figure 2A:
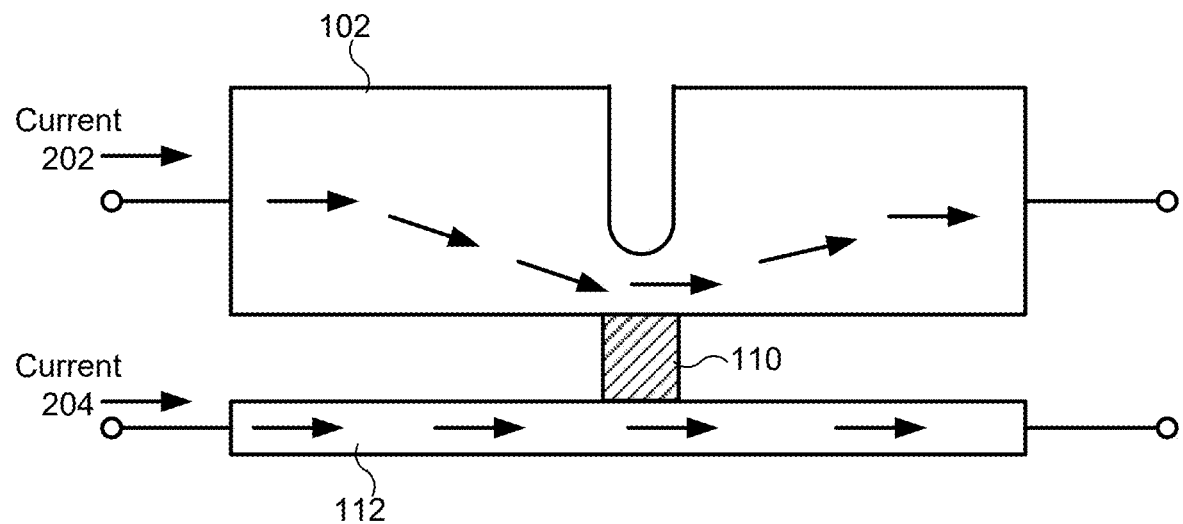
FIGS. 2A-2E illustrate a prophetic example of a representative operating sequence of the circuit of FIG. 1A in accordance with some embodiments.

FIGS. 2A-2E illustrate a prophetic example of a representative operating sequence of circuit 100 of FIG. 1A in accordance with some embodiments. FIG. 2A shows circuit 100 at a first time. At the first time, current 202 is applied to superconducting component 102 (via terminal 106) and current 204 is applied to superconducting component 112 (via terminal 114). In FIG. 2A both superconducting components 102, 112 are in a superconducting state (e.g., a zero electrical resistance state).

Figure 2B:
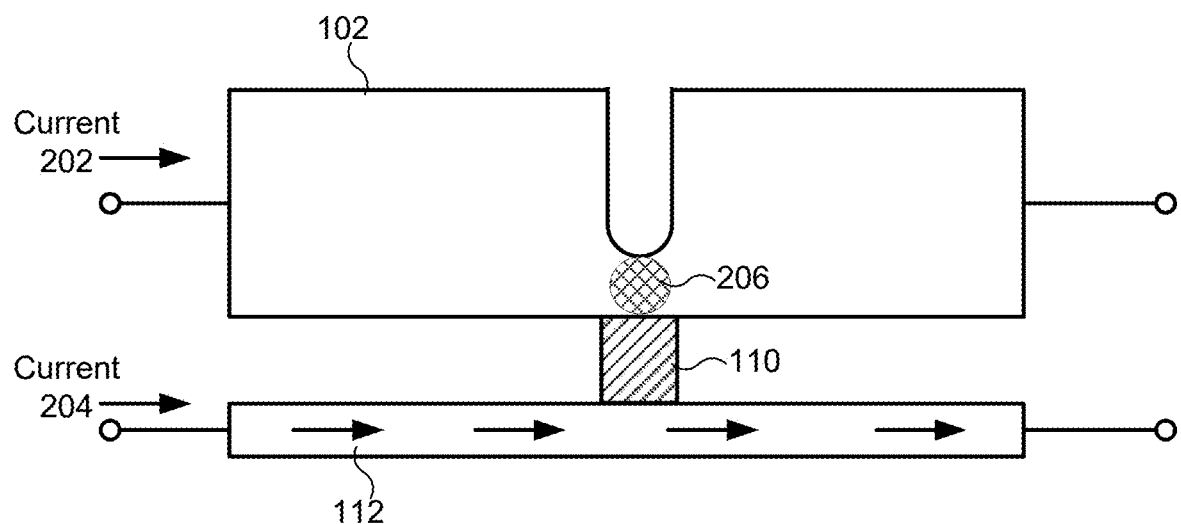

FIG. 2B shows circuit 100 at a second time subsequent to the first time. At the second time, a portion of the constriction region 104, denoted as region 206, has transitioned to a non-superconducting state (e.g., a non-zero electrical resistance state). In some embodiments, current 202 exceeds a superconducting current threshold and thus triggers the transition of the constriction region 104 to the non-superconducting state.

Figure 2C:
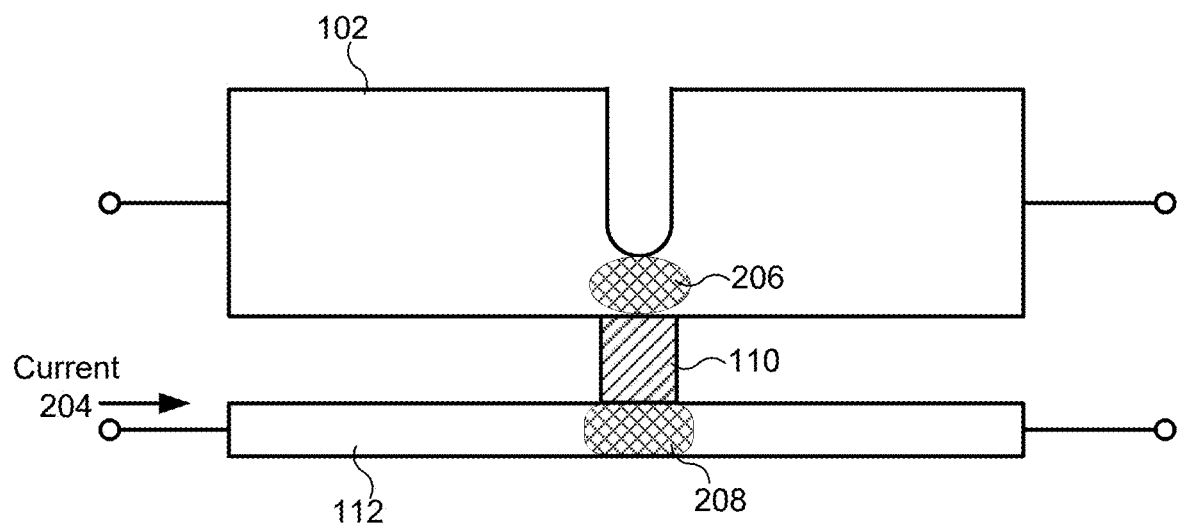

FIG. 2C shows circuit 100 at a third time subsequent to the second time. At the third time, non-superconducting region 206 has expanded and a portion of superconducting component 112, denoted as region 208, has transitioned to the non-superconducting state. In some embodiments, heat generated by region 206 transfers through coupling component 110 to superconducting component 112. The transferred heat lowers a superconducting current threshold for superconducting component 112 and current 204 exceeds the lowered threshold, thus transitioning region 208 to the non-superconducting state.

Figure 2D:
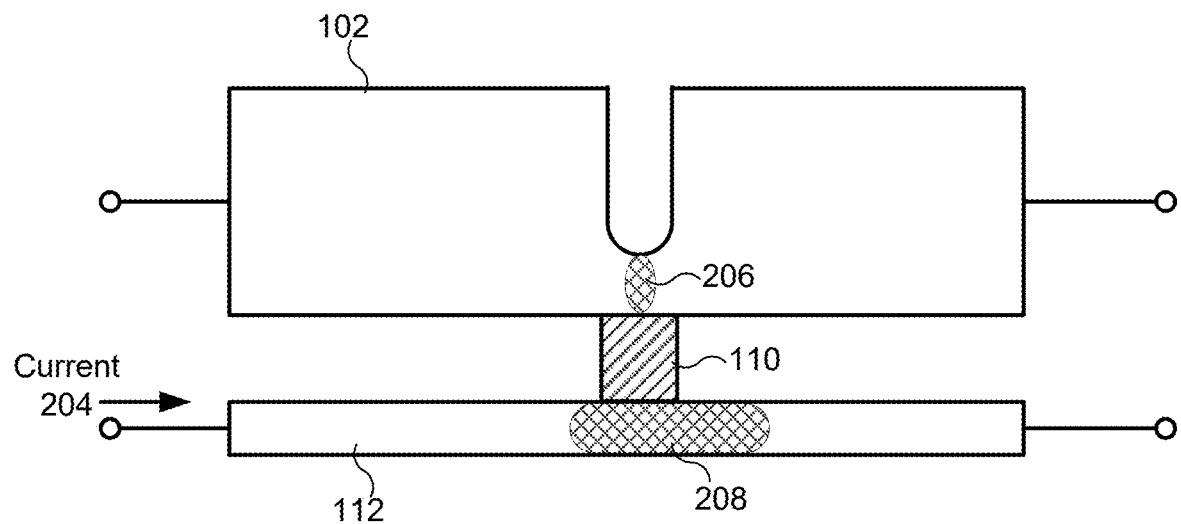

FIG. 2D shows circuit 100 at a fourth time subsequent to the third time. At the fourth time, non-superconducting region 206 has shrunk and region 208 has expanded. In some embodiments, the width of superconducting component 102 is sufficient to dissipate heat from region 206 and thus prevent further expansion of region 206. In some embodiments, the width of superconducting component 112 is insufficient to prevent further expansion of region 208.

Figure 2E:
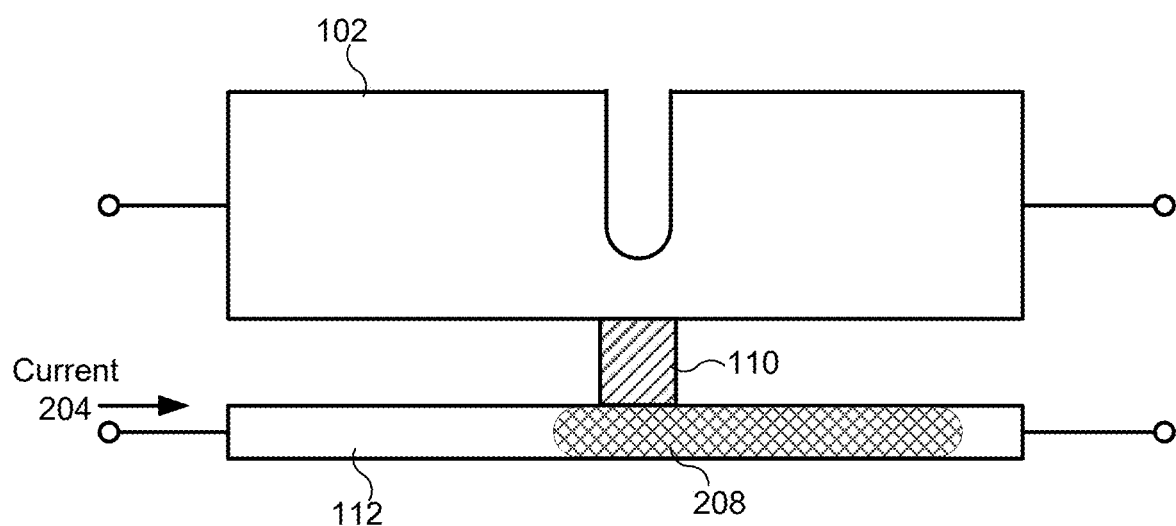

FIG. 2E shows circuit 100 at a fifth time subsequent to the fourth time. At the fifth time, superconducting component 102 has transitioned back to the superconducting state, and region 208 has further expanded. In some embodiments, superconducting component 102 does not transition back to the superconducting state at the fifth time. In some embodiments, at least a portion of superconducting component 102 maintains the non-superconducting state due to heat transfer from superconducting component 112 via coupling component 110. In some embodiments, the portion of the superconducting component is maintained in the non-superconducting state until the current 204 is removed. In some embodiments, the portion of the superconducting component is maintained in the non-superconducting state for a preset amount of time that is based on an inductance coupled to the superconducting component 102.

Thus, FIGS. 2A-2E illustrate a process of generating an expanded non-superconducting region (e.g., region 208 in FIG. 2E) in superconducting component 112 from an input current (e.g., input current 202 in FIG. 2A) applied to superconducting component 102. In this way, in some embodiments, a small input current may be used to generate a high impedance in superconducting component 112 (e.g., 1 mega Ohm).

Figure 3:
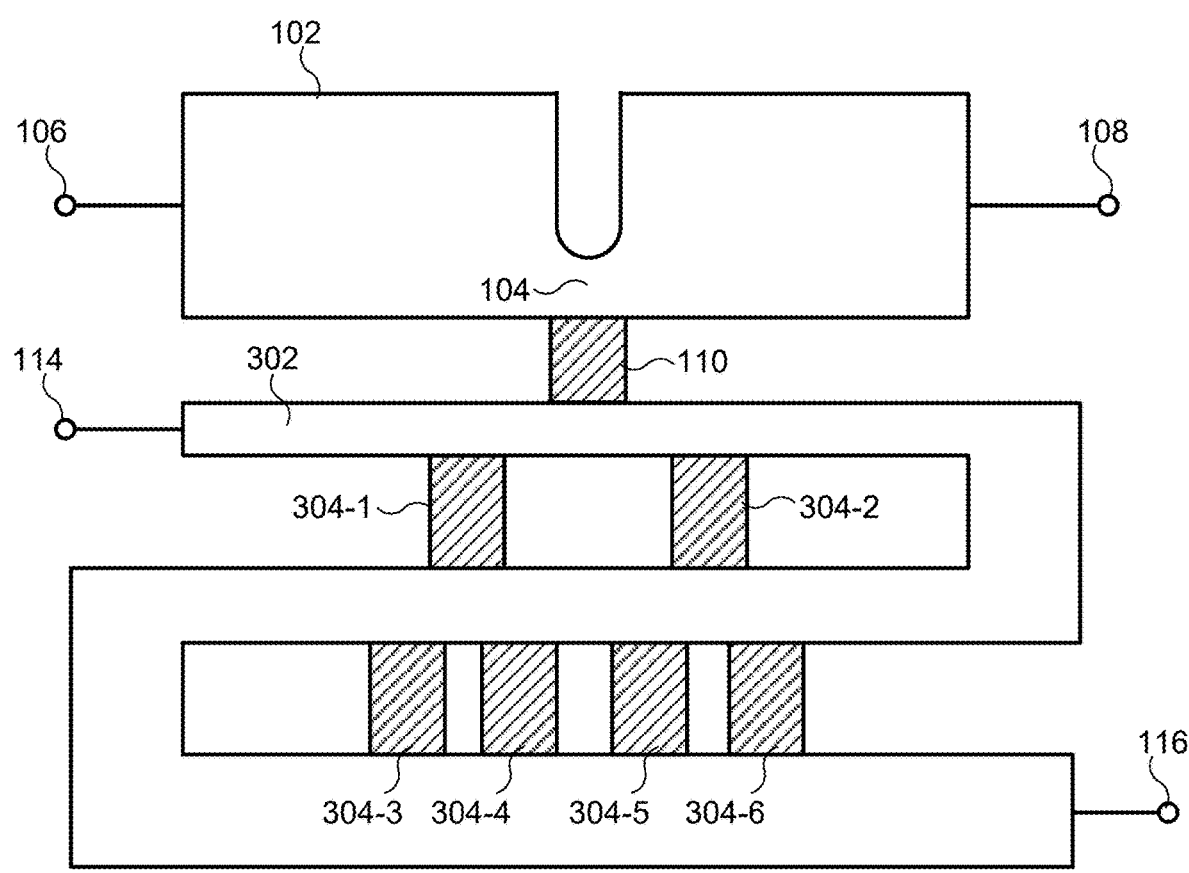
FIG. 3 is a block diagram illustrating another representative circuit in accordance with some embodiments.

FIG. 3 is a block diagram illustrating circuit 300 in accordance with some embodiments. FIG. 3 shows circuit 300 having superconducting component 102 and superconducting component 302. FIG. 3 further shows terminals 106 and 108 connected to superconducting component 102 and terminals 114 and 116 connected to superconducting component 302. Superconducting component 102 includes constriction region 104 adjacent to coupling component 110, which thermally-couples superconducting components 102 and 302. FIG. 3 also shows coupling components 304 (e.g., components 304-1 through 304-6) thermally coupling portions of superconducting component 302 to one another. Although FIG. 3 shows the component 302 increasing in size from the terminal 114 to the terminal 116, in some embodiments, the component 302 does not increase in size. The shapes of the superconducting components, constriction regions, and coupling components shown in FIG. 3 are intended as non-limiting examples. As one skilled in the art would recognize after reading the instant application, other geometric and irregular shapes could be used.

Figure 4A:
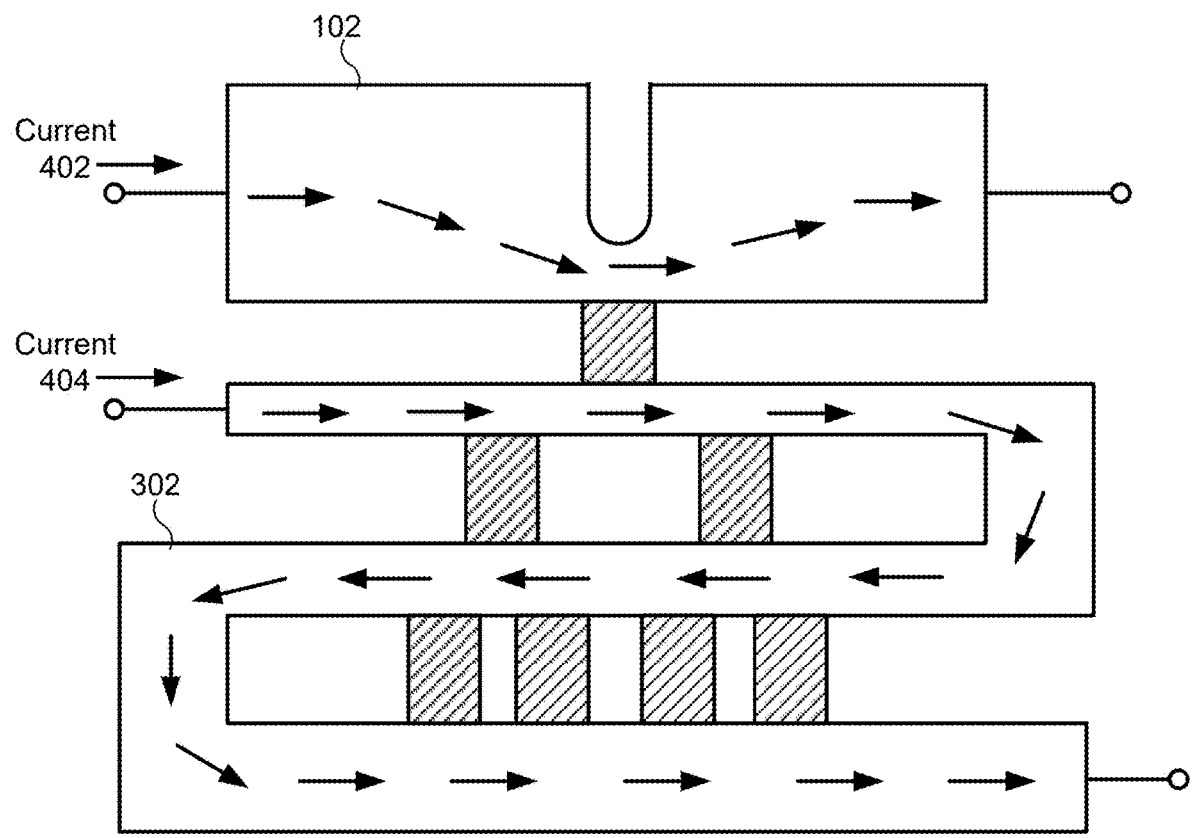
FIGS. 4A-4H illustrate a prophetic example of a representative operating sequence of the circuit of FIG. 3 in accordance with some embodiments.

FIGS. 4A-4H illustrate a prophetic example of a representative operating sequence of circuit 300 of FIG. 3 in accordance with some embodiments. FIG. 4A shows circuit 300 at a first time. At the first time, current 402 is applied to superconducting component 102 (via terminal 106) and current 404 is applied to superconducting component 302 (via terminal 114). In FIG. 4A both superconducting components 102, 302 are in a superconducting state (e.g., a zero electrical resistance state).

Figure 4B:
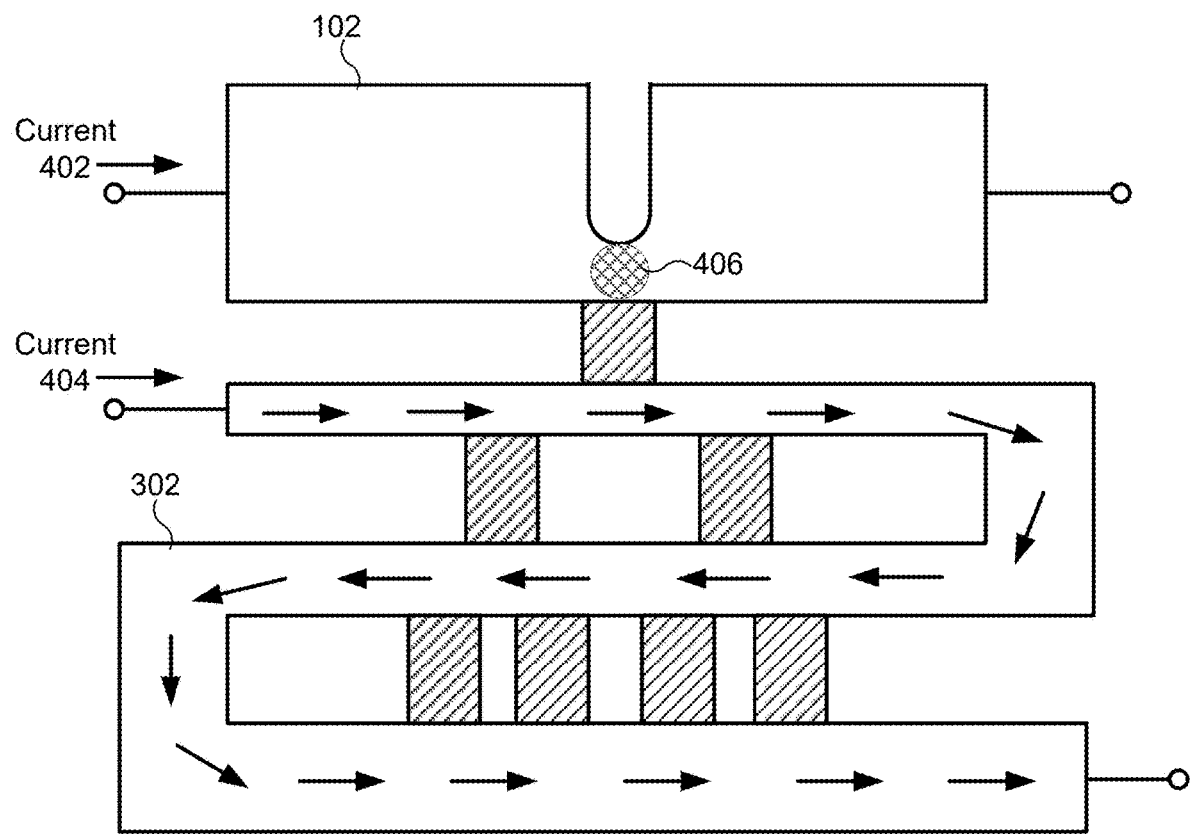

FIG. 4B shows circuit 300 at a second time subsequent to the first time. At the second time, a portion of constriction region 104, denoted as region 406, has transition to a non-superconducting state (e.g., a non-zero electrical resistance state). In some embodiments, current 402 exceeds a superconducting current threshold and thus triggers the transition of the constriction region 104 to the non-superconducting state.

Figure 4C:
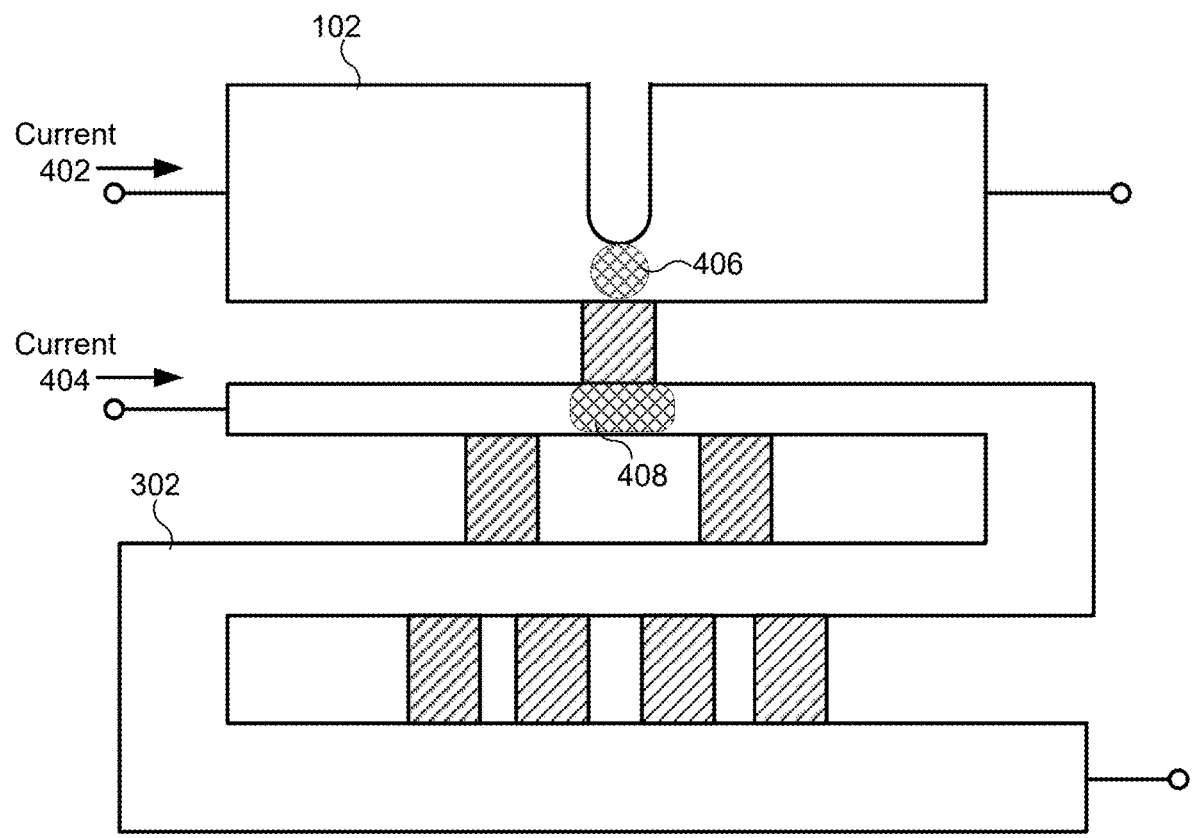

FIG. 4C shows circuit 300 at a third time subsequent to the second time. At the third time, a portion of superconducting component 302, denoted as region 408, has transitioned to the non-superconducting state. In some embodiments, heat generated by non-superconducting region 406 transfers through coupling component 110 to superconducting component 302. The transferred heat lowers a superconducting current threshold for superconducting component 302 and current 404 exceeds the lowered threshold, thus transitioning region 408 to the non-superconducting state.

Figure 4D:
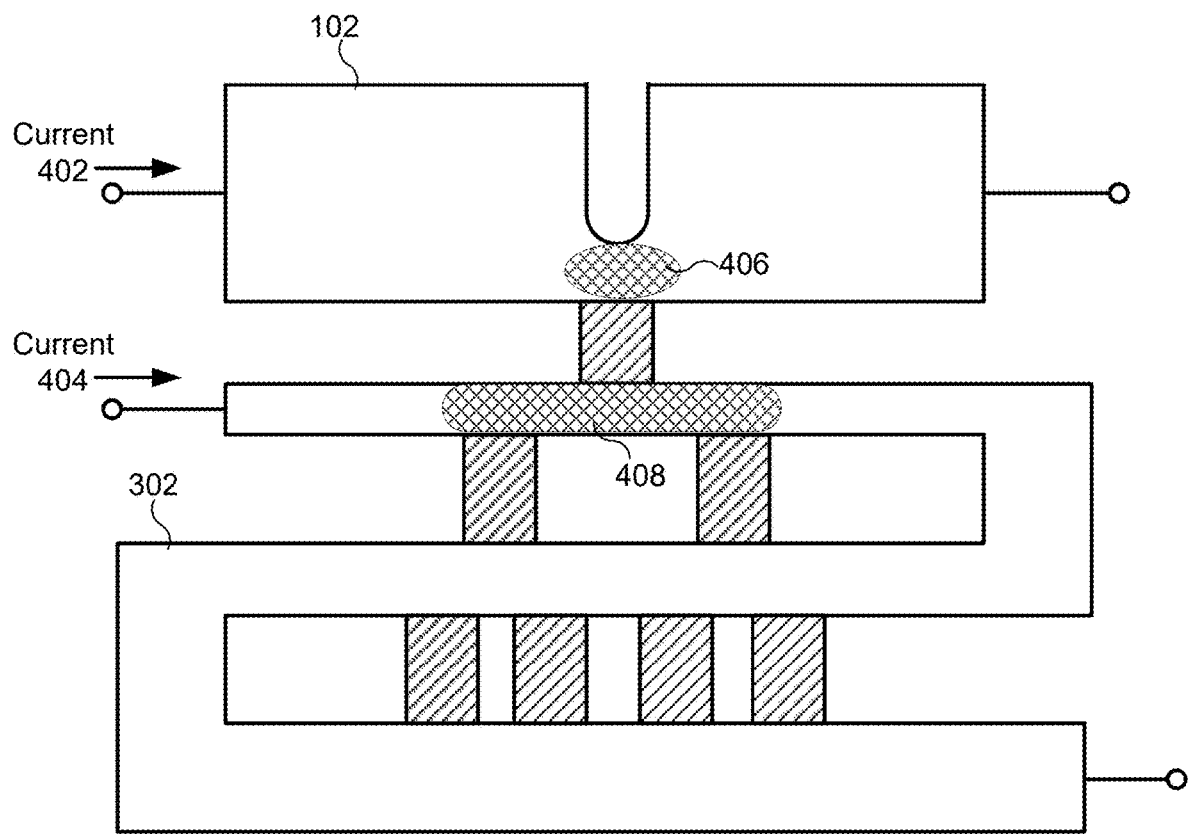
Figure 4E:
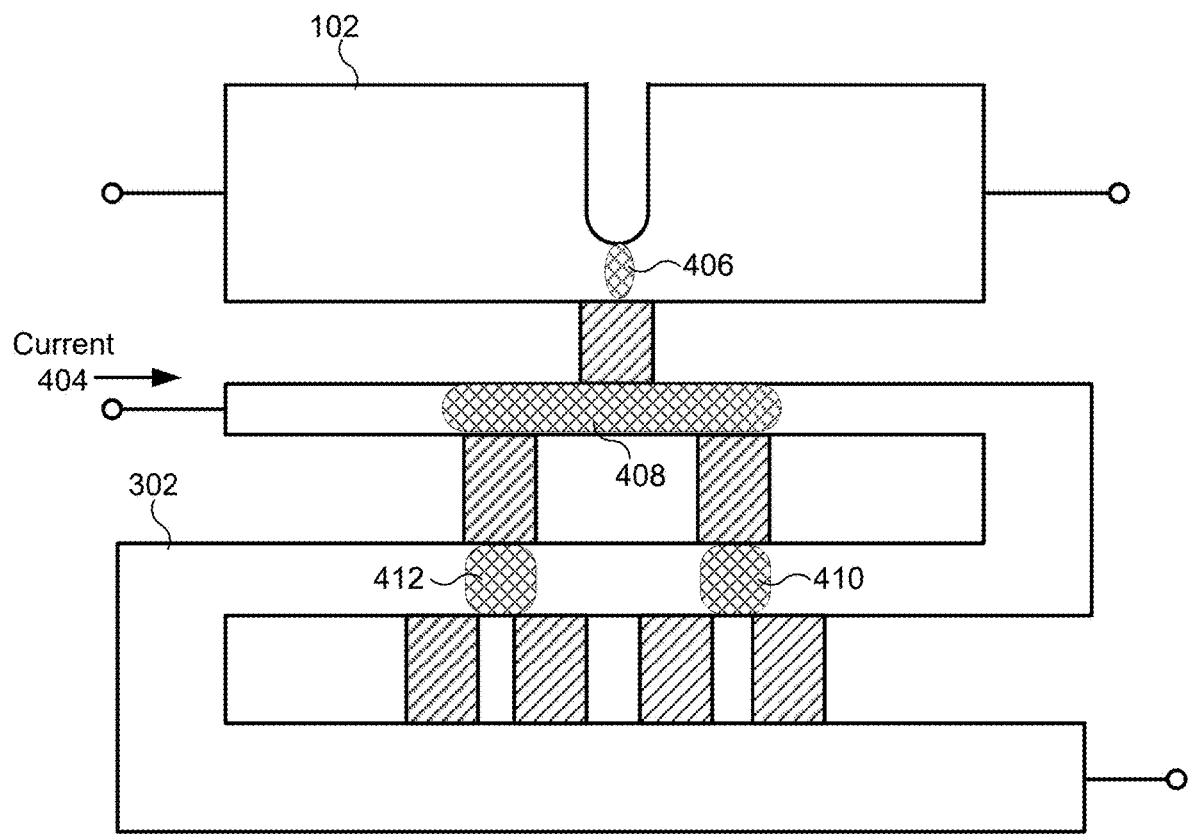

FIG. 4D shows circuit 300 at a fourth time subsequent to the third time. At the fourth time, non-superconducting regions 406 and 408 have expanded. FIG. 4E shows circuit 300 at a fifth time subsequent to the fourth time. At the fifth time, non-superconducting region 406 has shrunk and superconducting region 408 has expanded. In some embodiments, the width of superconducting component 102 is sufficient to dissipate heat from region 406 and thus prevent further expansion of region 406. In some embodiments, the width of superconducting component 302 is insufficient to prevent further expansion of region 408. Additionally, at the fifth time, portions of superconducting component 302, denoted as regions 410 and 412, have transitioned to the non-superconducting state. In some embodiments, heat generated by region 408 transfers through coupling components 304-1 and 304-2 to regions 410 and 412 of superconducting component 302. The transferred heat transitions regions 410 and 412 to the non-superconducting state.

Figure 4F:
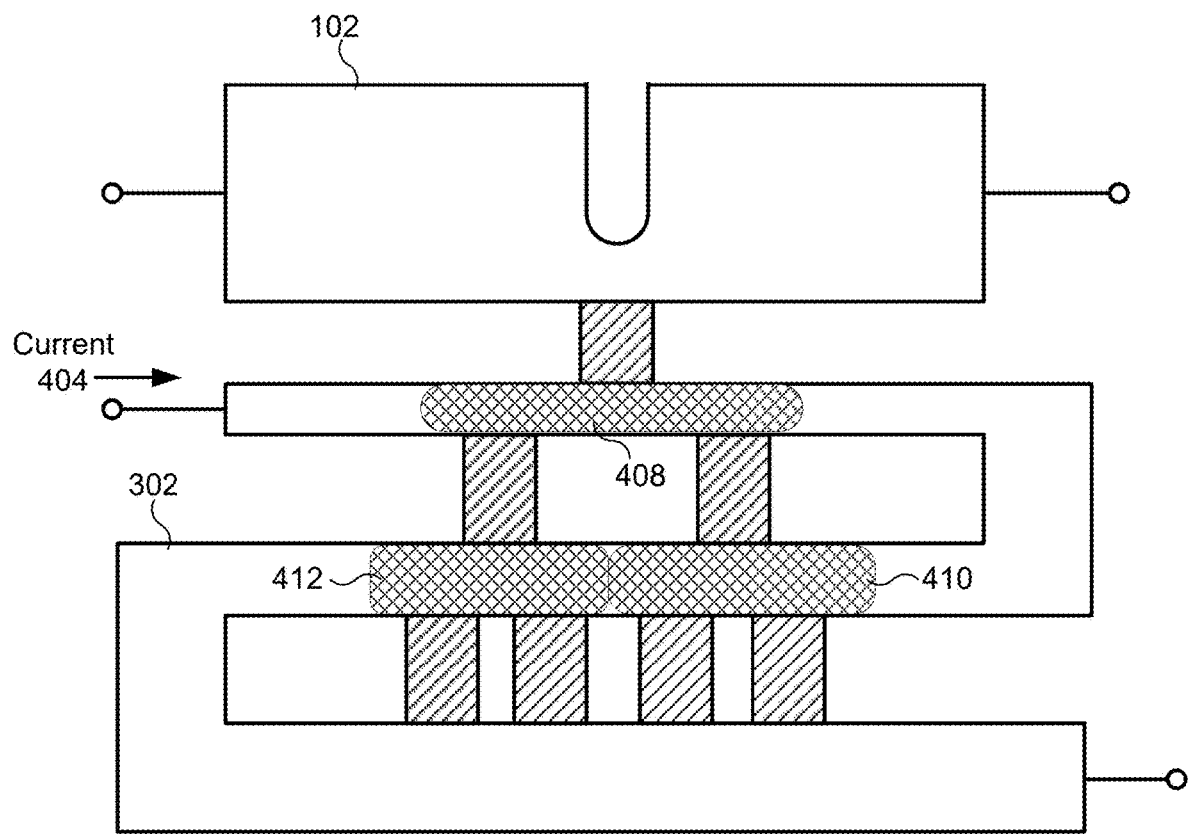
Figure 4G:
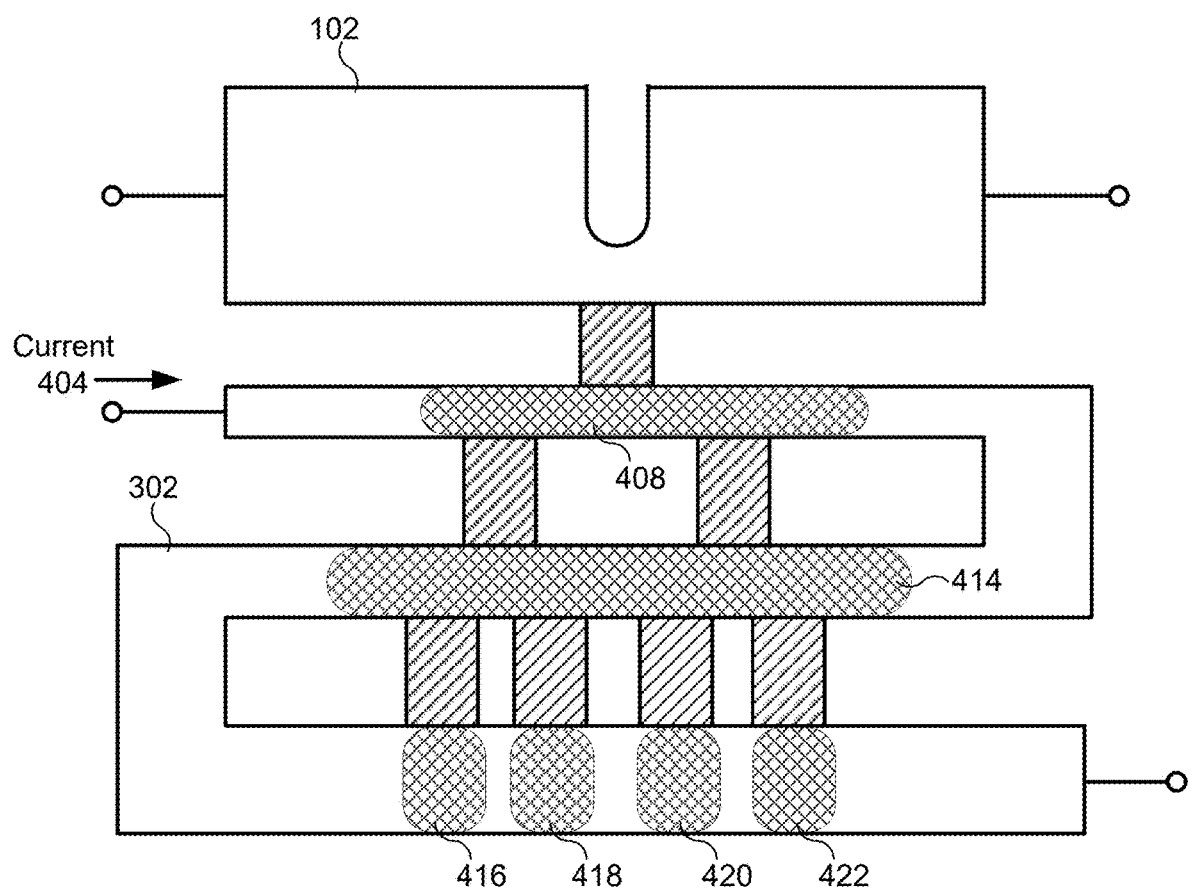

FIG. 4F shows circuit 300 at a sixth time subsequent to the fifth time. At the sixth time, superconducting component 102 has transitioned back to the superconducting state, and regions 410 and 412 have expanded. FIG. 4G shows circuit 300 at a seventh time subsequent to the sixth time. At the seventh time, regions 410 and 412 have expanded into region 414 and portions of superconducting component 302, denoted as regions 416, 418, 420, and 422, have transitioned to the non-superconducting state. In some embodiments, heat generated by region 414 transfers through coupling components 304-3-304-6 to regions 416, 418, 420, and 422 of superconducting component 302. The transferred heat transitions regions 416, 418, 420, and 422 to the non-superconducting state.

Figure 4H:
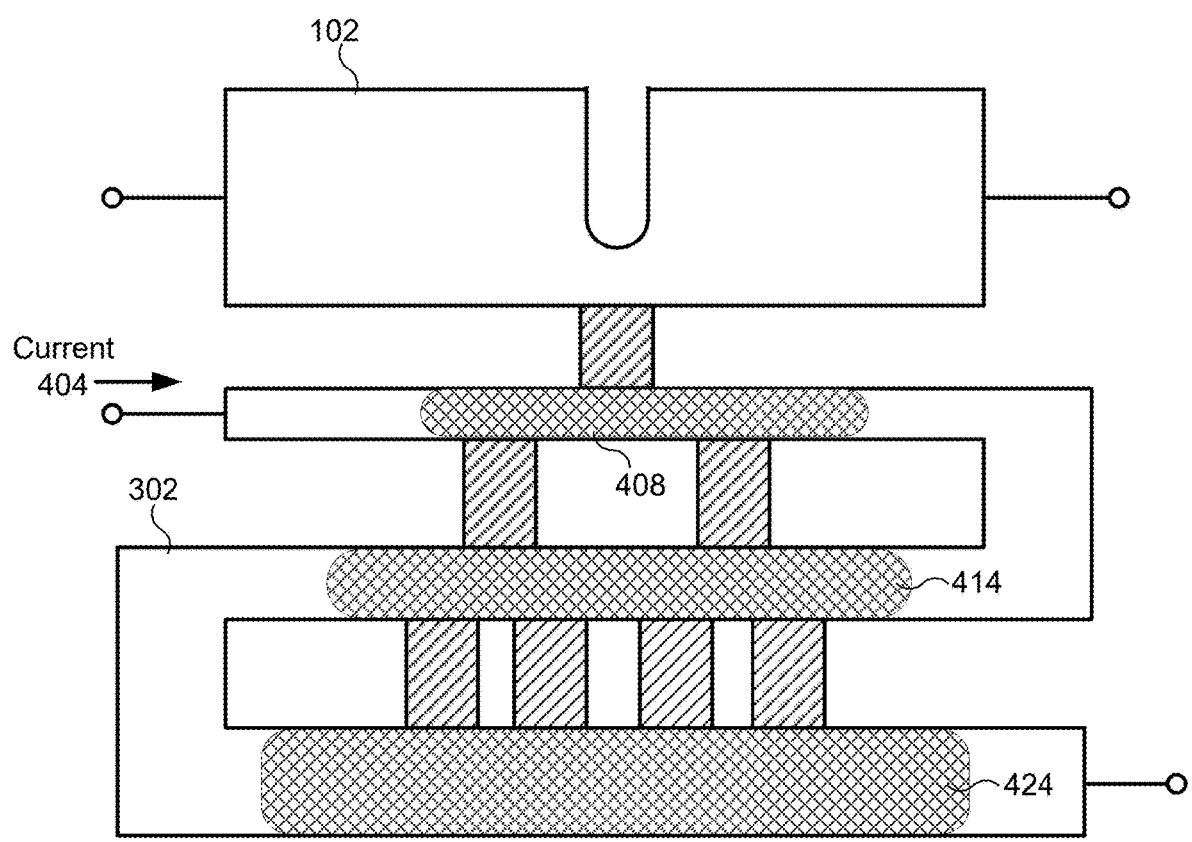

FIG. 4H shows circuit 300 at an eighth time subsequent to the seventh time. At the eighth time, non-superconducting regions 416, 418, 420, and 422 have expanded into region 424. In some embodiments, the portion of the superconducting component 302 is maintained in the non-superconducting state until the current 404 is removed. In some embodiments, the portion of the superconducting component 302 is maintained in the non-superconducting state for a preset amount of time that is based on an inductance coupled to the superconducting component 302.

Thus, FIGS. 4A-4H illustrate a process of generating expanded non-superconducting regions (e.g., regions 408, 414, and 424 in FIG. 4H) in superconducting component 302 from an input current (e.g., input current 402 in FIG. 4A) applied to superconducting component 102. In this way, in some embodiments, a small input current may be used to generate a high impedance in superconducting component 302 (e.g., 10 mega Ohm).

Figure 5:
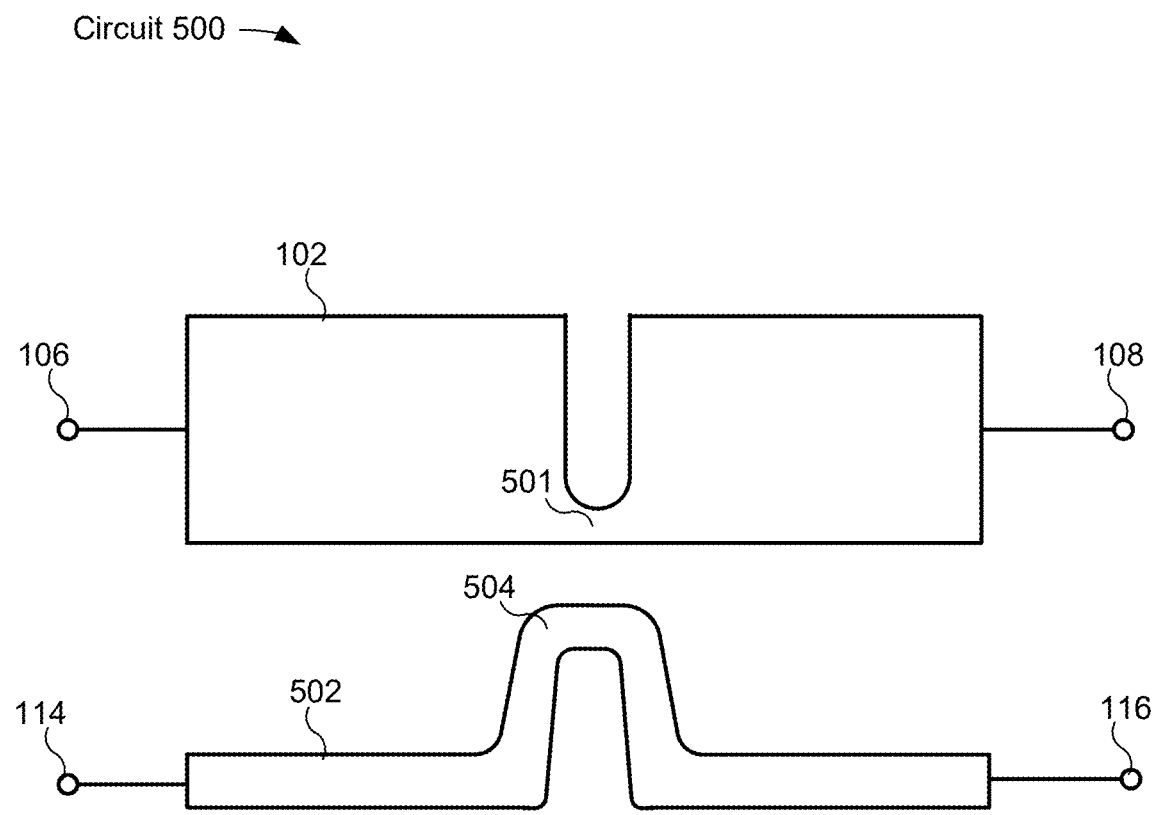
FIG. 5 is a block diagram illustrating another representative circuit in accordance with some embodiments.

FIG. 5 is a block diagram illustrating circuit 500 in accordance with some embodiments. FIG. 5 shows circuit 500 having superconducting component 102 and a component 502. Similar to component 708 in FIG. 7, described below, in some embodiments, component 502 is a superconductor, while in some other embodiments, component 502 is a non-superconducting component, e.g., a resistive component formed from a metal material, a semiconducting material or any other resistive material. In some embodiments, component 502 comprises a metal and/or doped semiconductor. In embodiments in which component 502 comprises a metal or doped semiconductor, some heat is generated through region 504 of component 502 as current flows between terminals 114 and 116.

FIG. 5 further shows terminals 106 and 108 connected to the superconducting component 102 and terminals 114 and 116 connected to the component 502. Superconducting component 102 includes constriction region 501 adjacent to region 504 of component 502, which thermally-couples components 102 and 502. Although not shown in FIG. 5, in some embodiments, the components 102 and 502 are thermally coupled by a coupling component, such as the coupling component 110 shown in FIG. 1B.

The circuit 500 in FIG. 5 is similar to the circuit 100 in FIG. 1A, except that only a portion of the component 502, region 504, is in close proximity to the superconducting component 102. In some circumstances, having only a portion of the component 502 in proximity to the superconducting component 102 allows for more control over the heat transfer between the components 102 and 502 and reduces heat dissipation effects of the component 502 by isolating the region 504.

In the embodiments shown in FIGS. 5 through 10D, the superconducting components or regions that are positioned adjacent to each other so as to allow the transfer of heat from one to the other are, at the same time, positioned so as to inhibit (e.g., prevent) cooper pair and/or electron tunneling between those superconducting components or regions (e.g., 10 nm, 100 nm, or more apart).

Figure 6A:
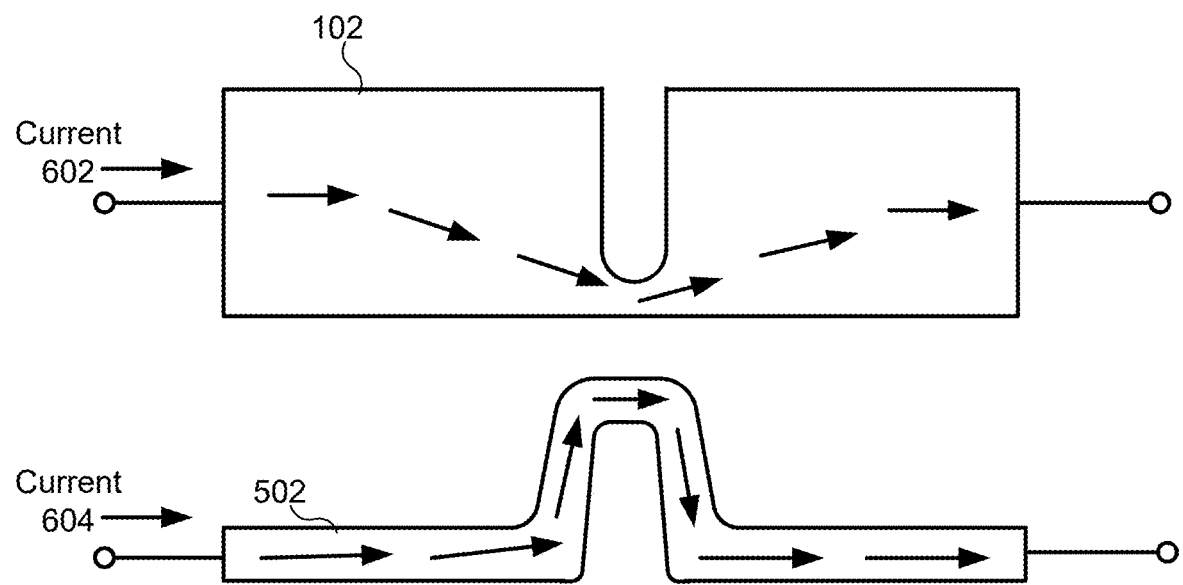
FIGS. 6A-6D illustrate a prophetic example of a representative operating sequence of the circuit of FIG. 5 in accordance with some embodiments.

FIGS. 6A-6D illustrate a prophetic example of a representative operating sequence of circuit 500 of FIG. 5 in accordance with some embodiments. FIG. 6A shows circuit 500 at a first time. At the first time, current 602 is applied to superconducting component 102 (via terminal 106) and current 604 is applied to component 502 (via terminal 114). In FIG. 6A both components 102 and 502 are in a superconducting state (e.g., a zero electrical resistance state).

Figure 6B:
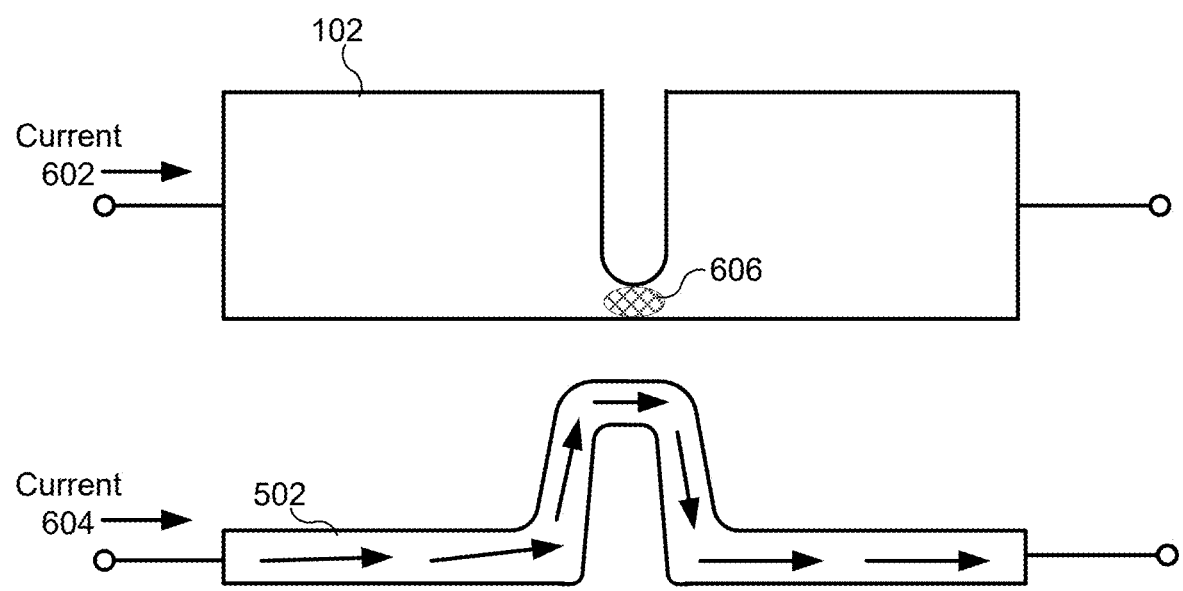

FIG. 6B shows circuit 500 at a second time subsequent to the first time. At the second time, a portion of constriction region 501, denoted as region 606, has transition to a non-superconducting state (e.g., a non-zero electrical resistance state). In some embodiments, current 602 exceeds a superconducting current threshold and thus triggers the transition of constriction region 104 to the non-superconducting state.

Figure 6C:
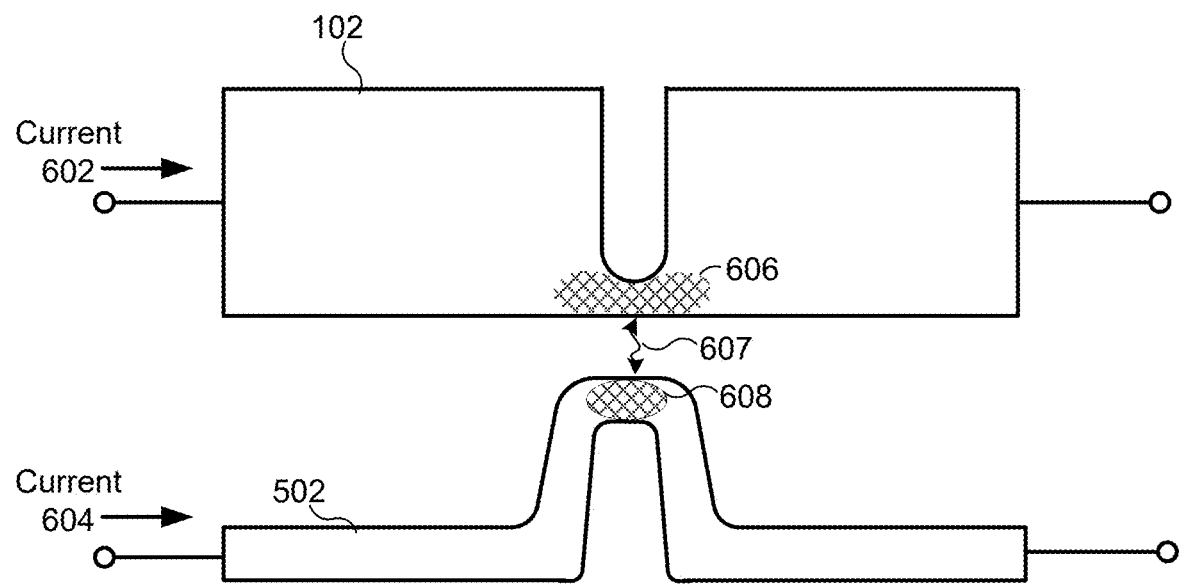

FIG. 6C shows circuit 500 at a third time subsequent to the second time. At the third time, non-superconducting region 606 has expanded and a portion of component 502 (which is a superconducting component in this example), denoted as region 608, has transitioned to the non-superconducting state. In some embodiments, heat generated by region 606 transfers to region 608 of superconducting component 502, as denoted by arrows 607. The transferred heat lowers a superconducting current threshold for superconducting component 502 and current 604 exceeds the lowered threshold, thus transitioning region 608 to the non-superconducting state.

Figure 6D:
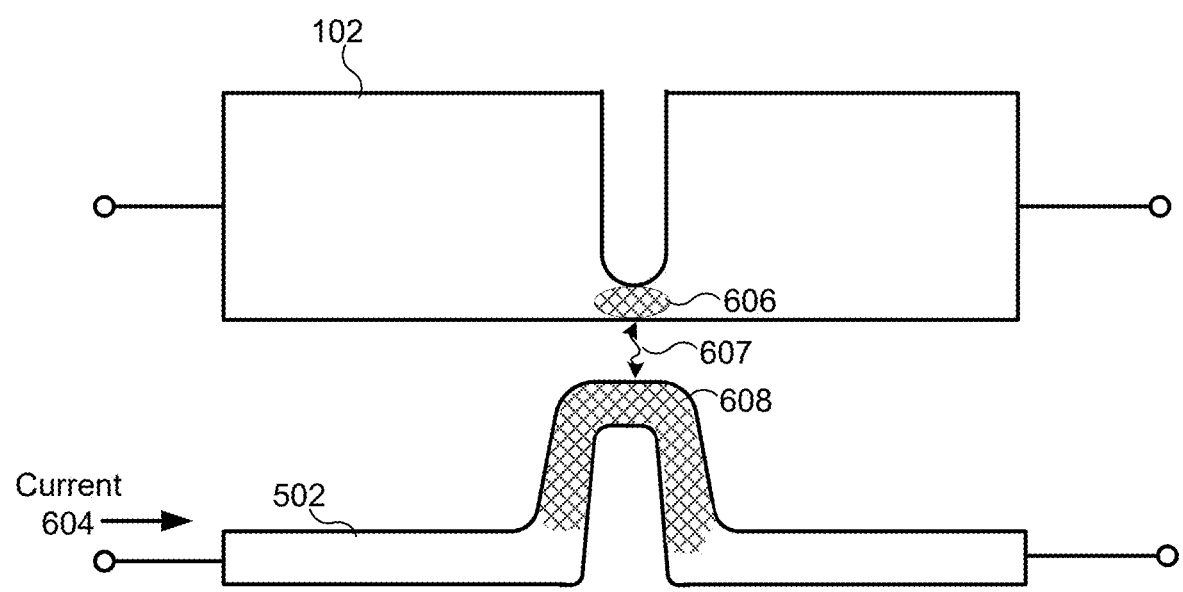

FIG. 6D shows circuit 500 at a fourth time subsequent to the third time. At the fourth time, non-superconducting region 606 has shrunk and non-superconducting region 608 has expanded. In some embodiments, the width of superconducting component 102 is sufficient to dissipate heat from region 606 and thus prevent further expansion of region 606. In some embodiments, the width of superconducting component 502 is insufficient to prevent further expansion of region 608. In some embodiments, the region 608 is maintained in the non-superconducting state until the current 604 is removed. In some embodiments, the region 608 is maintained in the non-superconducting state for a preset amount of time that is based on an inductance coupled to the superconducting component 502.

Figure 7:
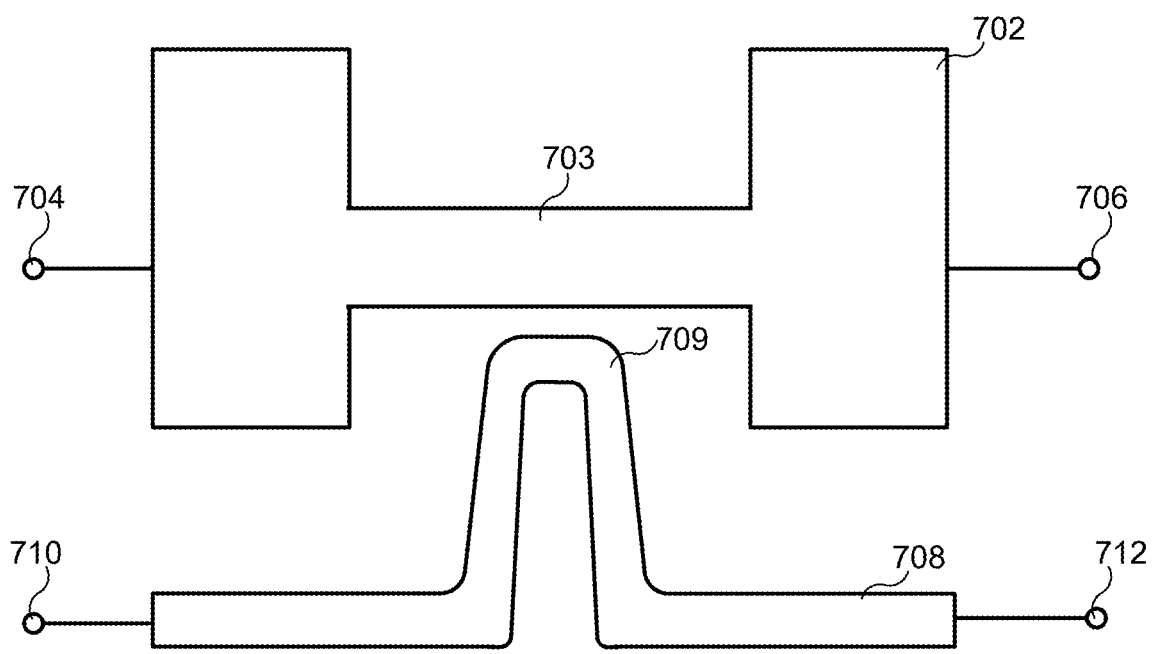
FIG. 7 is a block diagram illustrating another representative circuit in accordance with some embodiments.

FIG. 7 is a block diagram illustrating circuit 700 in accordance with some embodiments. FIG. 7 shows circuit 700 having superconducting component 702 and component 708. FIG. 7 further shows terminals 704 and 706 connected to the component 702 and terminals 710 and 712 connected to the component 708. Superconducting component 702 includes a narrow region 703 adjacent to region 709 of component 708, which thermally-couples superconducting components 702 and 708.

In some embodiments, component 708 is a superconductor. In some embodiments, component 708 is a non-superconducting component, e.g., a resistive component formed from a metal material, a semiconducting material or any other resistive material. In some embodiments, component 708 comprises a metal and/or doped semiconductor. In embodiments in which component 708 comprises a metal or doped semiconductor, some heat is generated through region 709 of component 708 as current flows between terminals 710 and 712. In some embodiments, component 708 comprises a metal and/or doped semiconductor and is configured such that exceeding a threshold current generates sufficient heat to transition component 702 from the superconducting state to the non-superconducting state. In some embodiments, the threshold current corresponds to a thermal coupling strength between region 709 of component 708 and region 703 of superconducting component 702.

Similar to that described above in reference to FIG. 1C, circuit 700 optionally has one or more components, e.g., resistive and/or inductive components, like components 152, 156, 163, and 166 described above, coupled to various combinations of terminals 710 and 712, which can be understood to be respective gate terminals in this example, and also various combinations of terminals 704 and 706, which can be understood to be respective drain and source terminals in this example. In some embodiments, component configurations can include: a resistive component, e.g., a resistor, on terminals 710 and/or 712; the circuit can be configured with a resistive component, on terminals 710 and/or 712 and with an inductor on terminal 704; the circuit can be configured with a resistive component, on terminals 710 and/or 713 and with an inductor on terminal 706 and; the circuit can be configured with at least one inductor on terminal 704 or terminal 706; and the circuit can be configured with any combination of resistors and inductors on terminals 710 and/or 712 in combination with either an inductor on terminal 704 or terminal 706. One of ordinary skill in the art having the benefit of this disclosure will appreciated that many other configurations of components on the terminal 106, 108, 114, and 116 are possible without departing from the scope of the present disclosure.

Figure 8A:
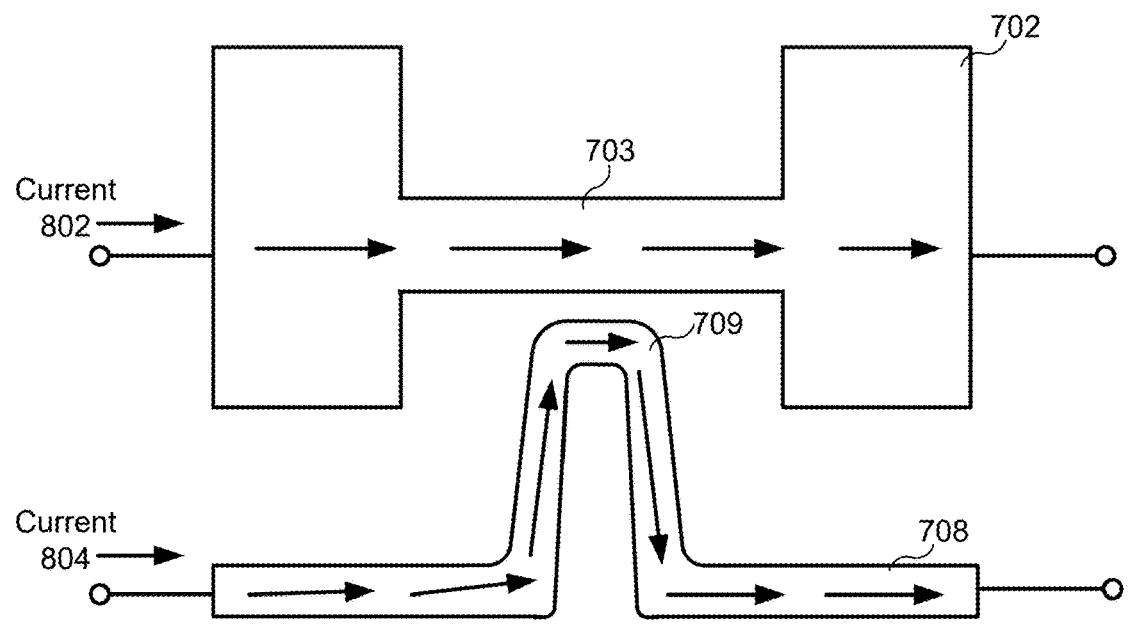
FIGS. 8A-8D illustrate a prophetic example of a representative operating sequence of the circuit of FIG. 7 in accordance with some embodiments.

FIGS. 8A-8D illustrate a prophetic example of a representative operating sequence of circuit 700 of FIG. 7 in accordance with some embodiments. FIG. 8A shows circuit 700 at a first time. At the first time, current 802 is applied to superconducting component 702 (via terminal 704) and current 804 is applied to superconducting component 708 (via terminal 710). In FIG. 8A both superconducting components 702 and 708 are in a superconducting state (e.g., a zero electrical resistance state).

Figure 8B:
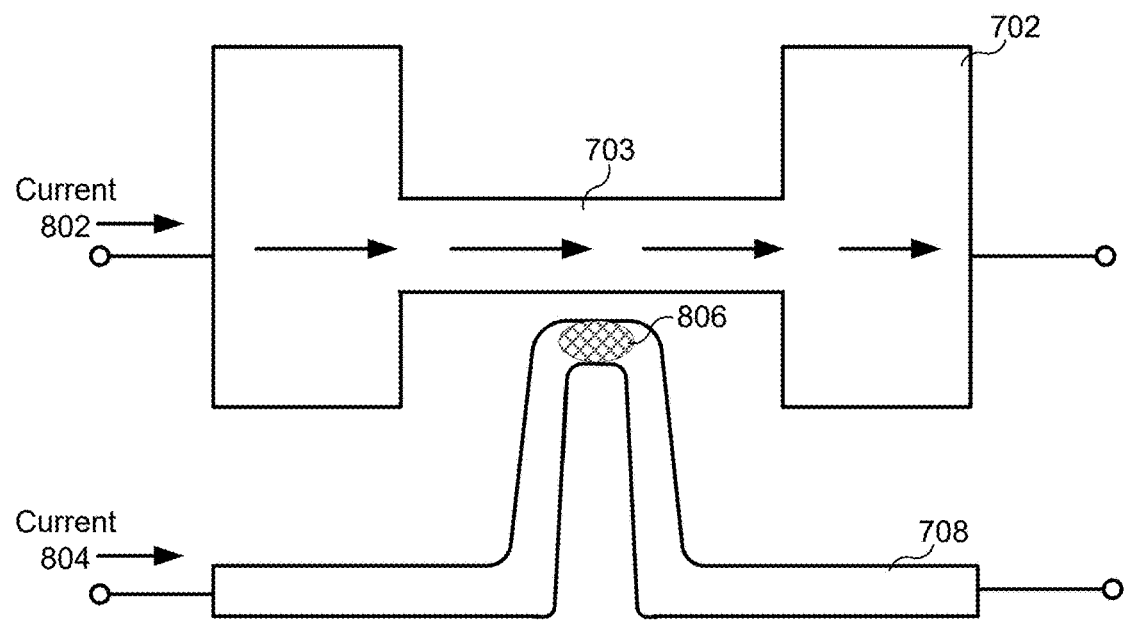

FIG. 8B shows circuit 700 at a second time subsequent to the first time. At the second time, a portion of superconducting component 708, denoted as region 806, has transition to a non-superconducting state (e.g., a non-zero electrical resistance state). In some embodiments, current 804 exceeds a superconducting current threshold and thus triggers the transition of region 806 to the non-superconducting state.

Figure 8C:
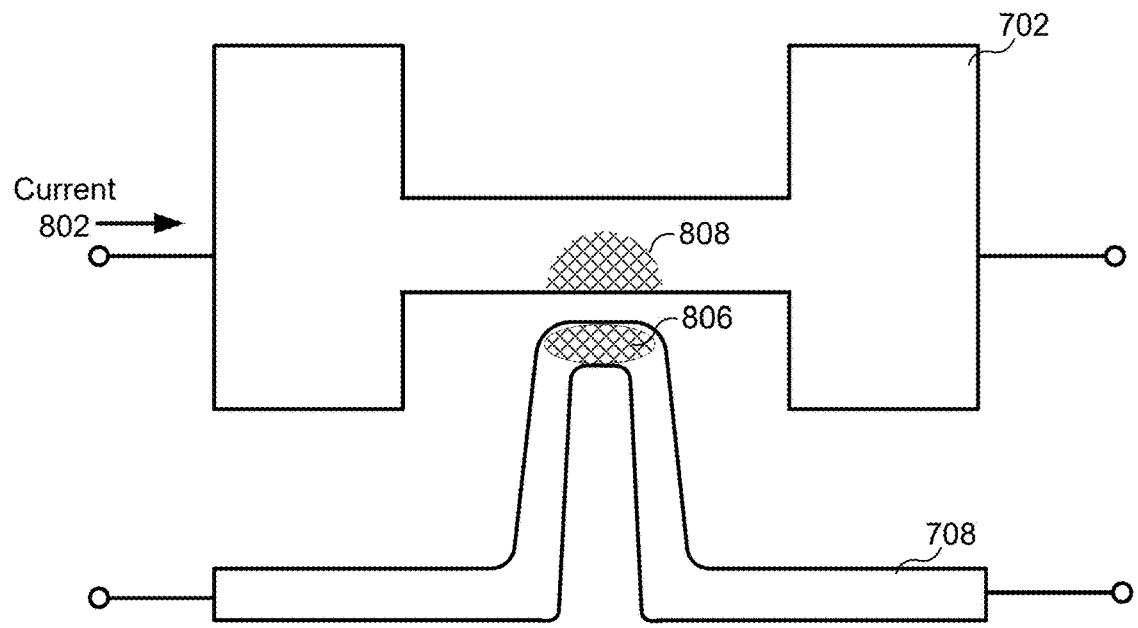
Figure 8D:
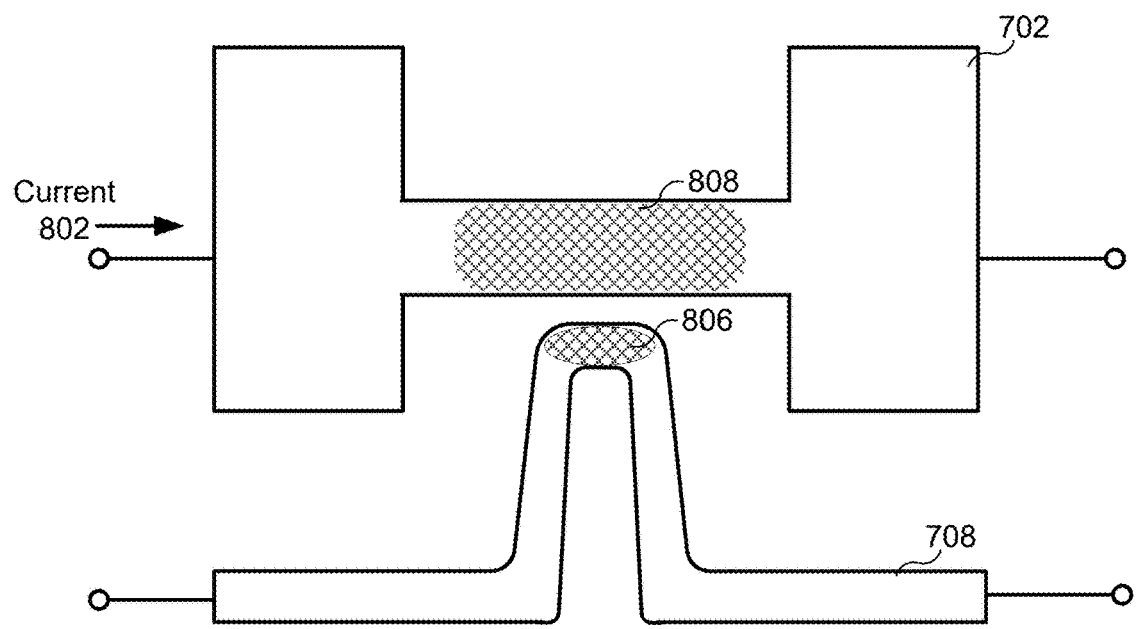

FIG. 8C shows circuit 700 at a third time subsequent to the second time. At the third time, non-superconducting region 806 has expanded and a portion of superconducting component 702, denoted as region 808, has transitioned to the non-superconducting state. In some embodiments, heat generated by region 806 transfers to region 808 of superconducting component 702. In some embodiments, the transferred heat lowers a superconducting current threshold for superconducting component 702 and current 802 exceeds the lowered threshold, thus transitioning region 808 to the non-superconducting state. In some embodiments, the transferred heat causes a temperature of the superconducting component 702 to exceed a superconducting threshold temperature, thereby transitioning region 808 to the non-superconducting state. FIG. 8D shows circuit 700 at a fourth time subsequent to the third time. At the fourth time, non-superconducting region 808 has expanded.

Figure 9A:
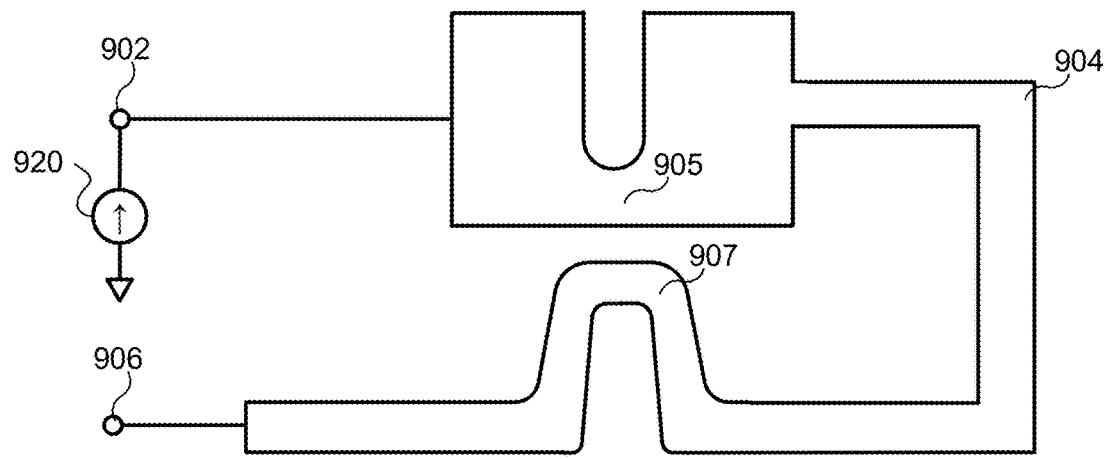
FIGS. 9A-9B are block diagrams illustrating representative circuits in accordance with some embodiments.
Figure 9B:
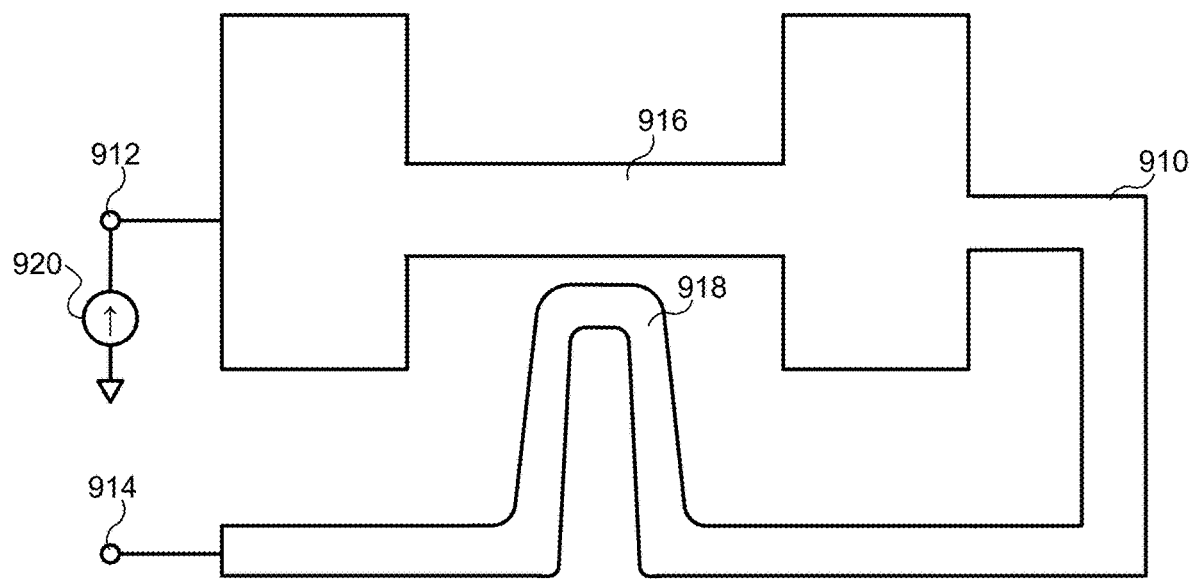

FIGS. 9A-9B are block diagrams illustrating representative circuits in accordance with some embodiments. FIG. 9A shows circuit 900 having superconducting component 904 and terminals 902 and 906 connected to superconducting component 904. Superconducting component 904 includes a constriction region 905 adjacent to region 907, which thermally couples regions 905 and 907. In some embodiments, regions 905 and 907 and thermally coupled by an electrically-insulating, thermally-conductive substrate on which superconducting component 904 is mounted or positioned, as discussed below with reference to FIGS. 13A-13C. FIG. 9B shows circuit 909 having superconducting component 910 and terminals 912 and 914 connected to superconducting component 910. Superconducting component 910 includes narrow region 916 adjacent to region 918, which thermally couples regions 916 and 918. In some embodiments, regions 916 and 918 and thermally coupled by an electrically-insulating, thermally-conductive substrate on which superconducting component 910 is mounted or positioned, as discussed below with reference to FIGS. 13A-13C.

Figure 10A:
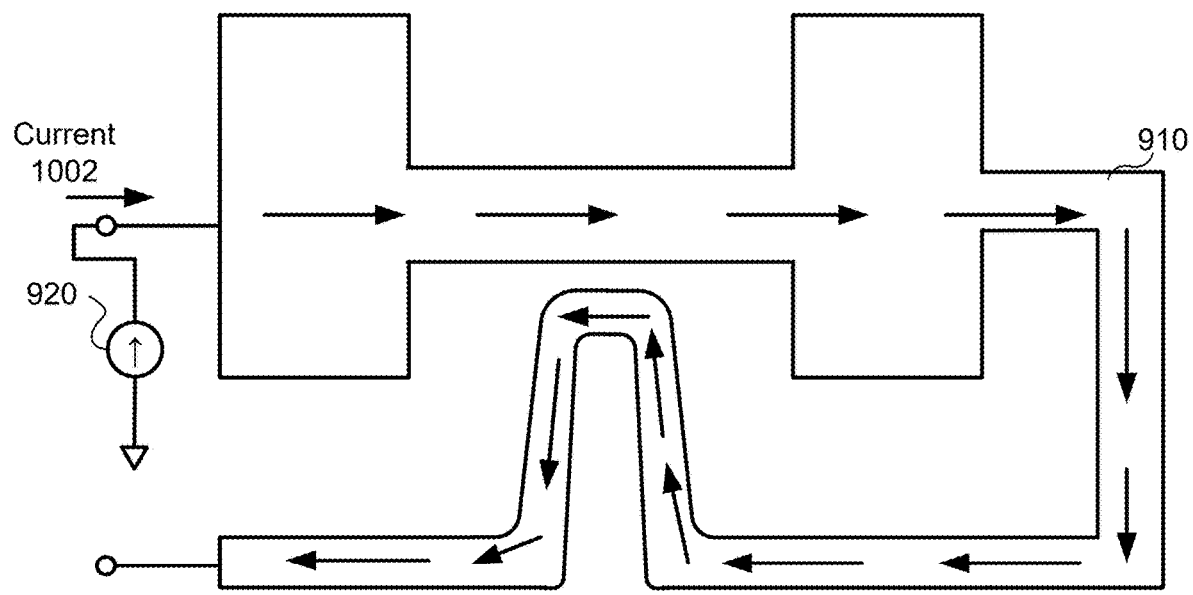
FIGS. 10A-10D illustrate a prophetic example of a representative operating sequence of the circuit of FIG. 9B in accordance with some embodiments.

FIGS. 10A-10D illustrate a prophetic example of a representative operating sequence of circuit 909 of FIG. 9B in accordance with some embodiments. FIG. 10A shows circuit 909 at a first time. At the first time, current 1002 is applied (e.g., by a current source 920, or by the output of another circuit, not shown) to superconducting component 910 (via terminal 912). In FIG. 10A superconducting component 910 is in a superconducting state (e.g., a zero electrical resistance state).

Figure 10B:
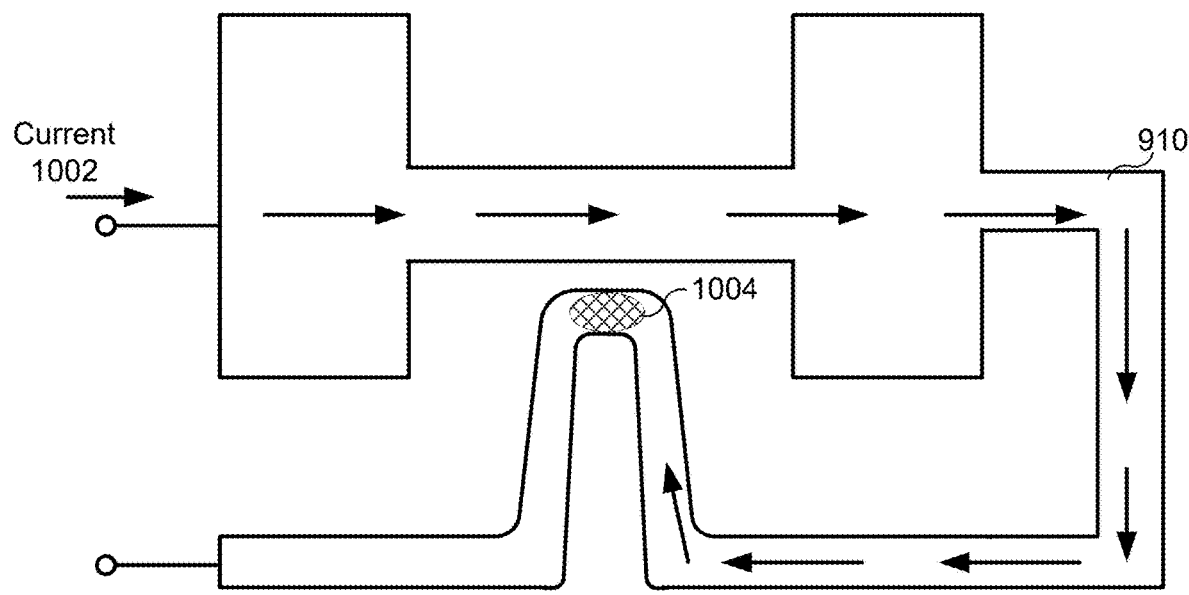

FIG. 10B shows circuit 909 at a second time subsequent to the first time. At the second time, a portion of superconducting component 910, denoted as region 1004, has transition to a non-superconducting state (e.g., a non-zero electrical resistance state). In some embodiments, current 1002 exceeds a superconducting current threshold and thus triggers the transition of region 1004 to the non-superconducting state.

Figure 10C:
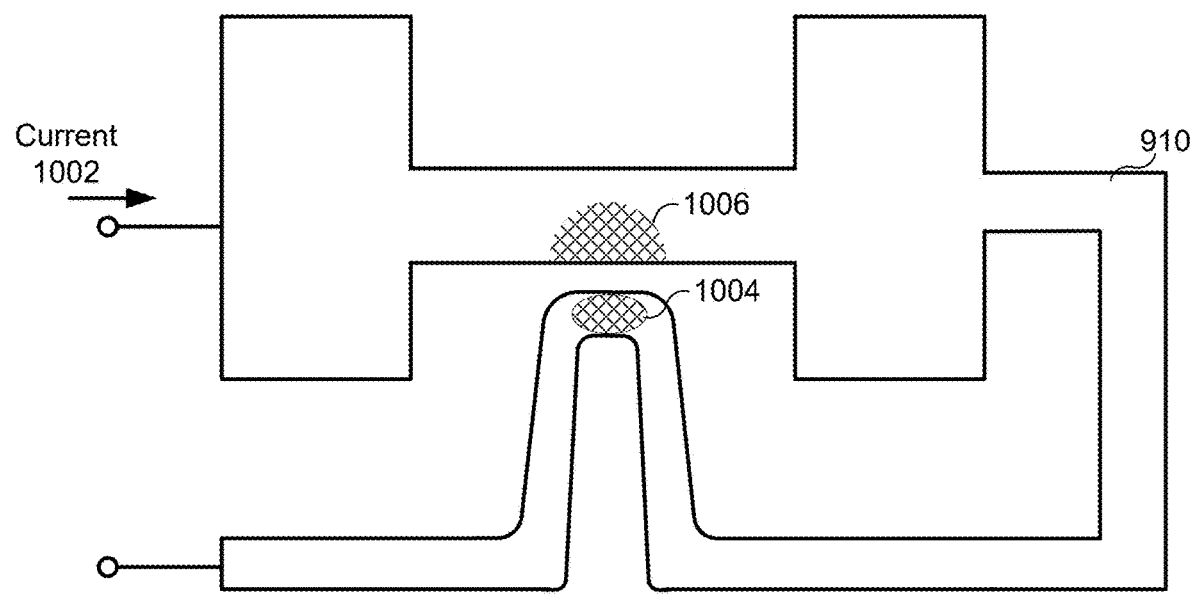
Figure 10D:
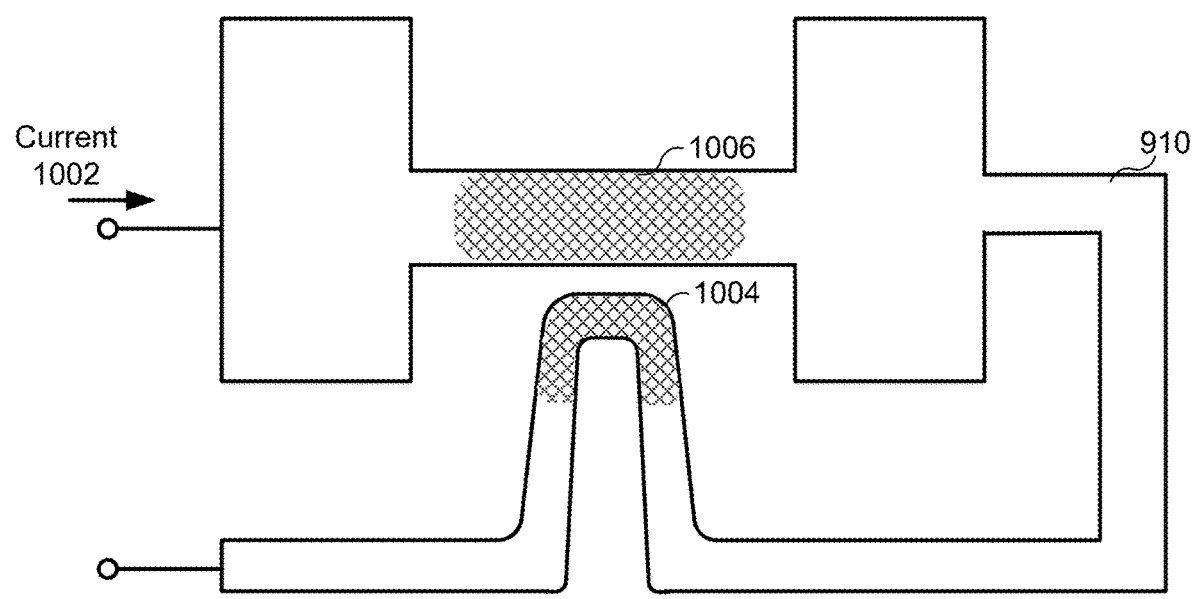

FIG. 10C shows circuit 909 at a third time subsequent to the second time. At the third time, a portion of superconducting component 910, denoted as region 1006, has transitioned to the non-superconducting state. In some embodiments, heat generated by region 1004 transfers to region 1006 of superconducting component 910. The transferred heat transitions region 1006 to the non-superconducting state. FIG. 10D shows circuit 909 at a fourth time subsequent to the third time. At the fourth time, non-superconducting regions 1004 and 1006 have expanded.

Figure 11:
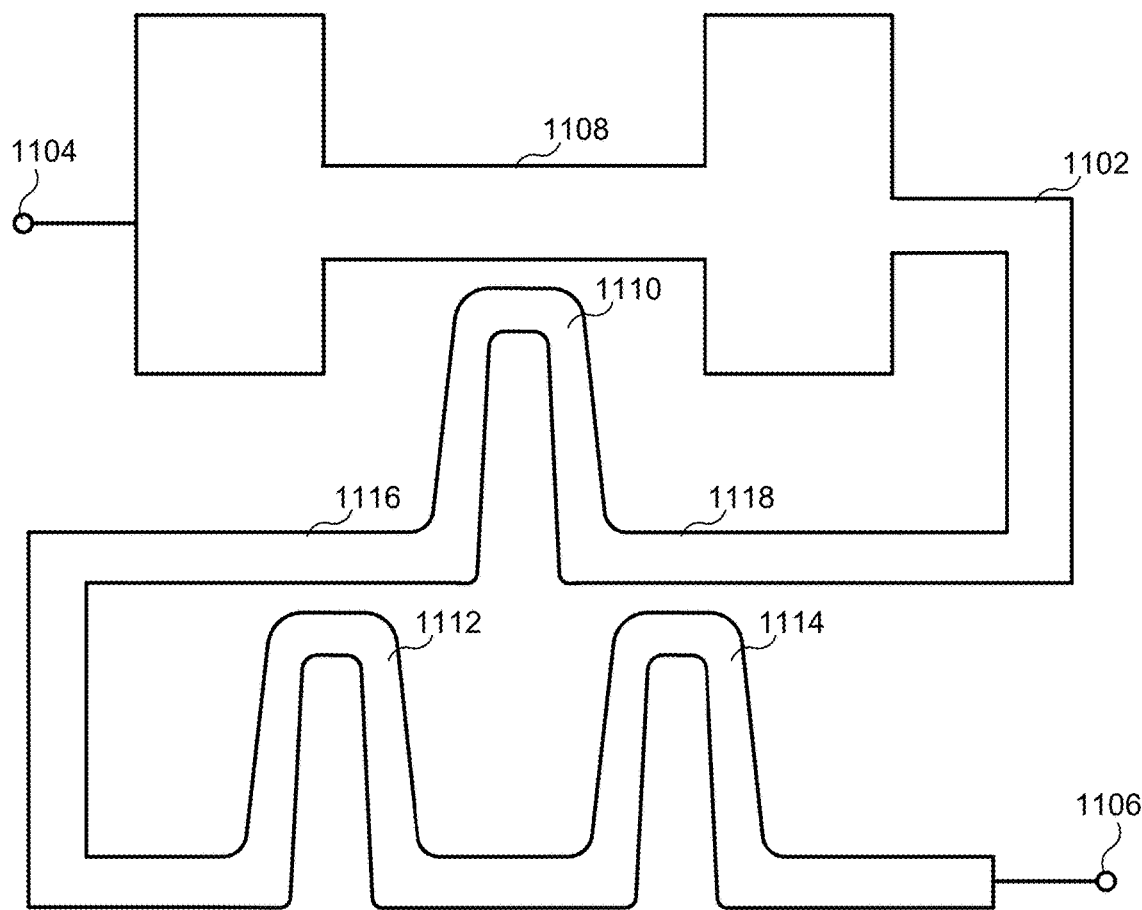
FIG. 11 is a block diagram illustrating another representative circuit in accordance with some embodiments.

FIG. 11 is a block diagram illustrating circuit 1100 in accordance with some embodiments. FIG. 11 shows circuit 1100 having superconducting component 1102 and terminals 1104 and 1106 connected to superconducting component 1102. Superconducting component 1102 includes narrow region 1108 adjacent to region 1110, which thermally-couples regions 1108 and 1110. Superconducting component 1102 also includes regions 1112 and 1114 near regions 1116 and 1118, which thermally-couples region 1112 to region 1116 and region 1114 to region 1118. The functionality of thermally-coupled regions is described above, e.g., with respect to FIGS. 4A-4H and 10A-10D.

FIG. 12 is a block diagram illustrating a detection circuit 1200 including the circuit 120 of FIG. 1B in accordance with some embodiments. The circuit 1200 also includes a photodetector 1212 (e.g., a photodiode that includes silicon, germanium, indium gallium arsenide, lead sulfide, and/or mercury cadmium telluride). In some embodiments, the photodetector 1212 is voltage-biased (e.g., using an optional voltage source). The photodetector 1212 is optionally any type of photodetector including, e.g., a superconducting nanowire single photon detector (SNSPD), a photodiode, and the like. In FIG. 12, the photodetector 1212 is electrically coupled to the circuit 120 via one or more resistors 1204 and/or one or more other electrical components (e.g., wires, inductors, etc.).

FIG. 12 also illustrates that the circuit 1200 optionally includes a readout circuit 1216, sources 1210 and 1218 (e.g., current and/or voltage sources), and/or additional electrical components, such as a capacitor 1214. In some embodiments, the readout circuit 1216 includes one or more superconductor and/or semiconductor components. In some embodiments, the readout circuit 1216 is configured to transition to a state that indicates whether a resistance of the circuit 120 is a logical 0 (e.g., resistance is greater than a predefined resistance threshold) or a logical 1 (e.g., resistance is less than the predefined resistance threshold), and thereby facilitates providing the logical state of the photodetector to other circuits or system components. In some embodiments, the readout circuit 1216 is configured to measure a current flowing through the circuit 120 or a voltage drop over the circuit 120. For example, in some embodiments, the readout circuit 1216 is a voltage readout circuit. In some embodiments, the readout circuit 1216 includes a resistor (e.g., 50 ohms) and the readout circuit is configured to measure a voltage drop over the resistor. In some embodiments, the readout circuit 1216 includes a voltage source or a current source.

In some embodiments, the source 1210 provides an electrical signal (e.g., an electrical current) that is used to bias the photodetector 1212 and/or the circuit 120. In some embodiments, the source 1218 provides an electrical signal (e.g., an electrical current) that is used to bias the readout circuit 1216 and/or the circuit 120.

An example operating sequence of the circuit 1200 is as follows. First, one or more photons are received by the photodetector 1212. The one or more photons cause the photodetector 1212 to have increased resistance (e.g., due to a transition of a superconducting component to a non-superconducting state). The increased resistance redirects current from the source 1210 to the circuit 120, e.g., via the optional resistor(s) 1204. The redirected current causes the circuit 120 to transition to a non-superconducting state (e.g., as shown in FIGS. 2A-2E). Once the circuit 120 has transitioned to the non-superconducting state additional voltage from the source 1218 drops across the circuit 120. Finally, the readout circuit 1216 detects the additional voltage drop and determines that the one or more photons were received.

Figure 13A:
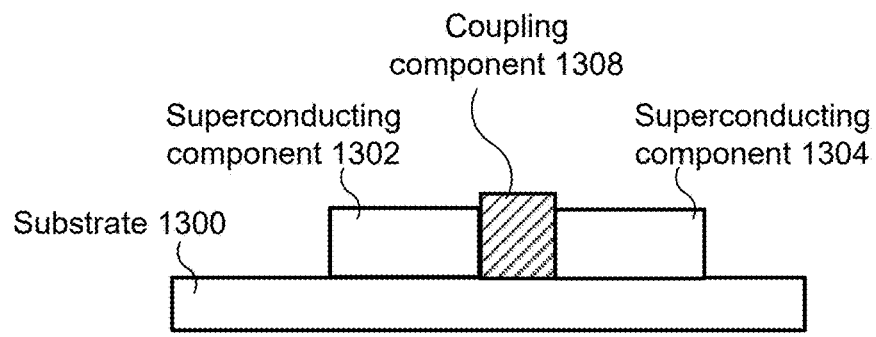
FIGS. 13A-13C illustrate components of a representative circuit in accordance with some embodiments.
Figure 13B:
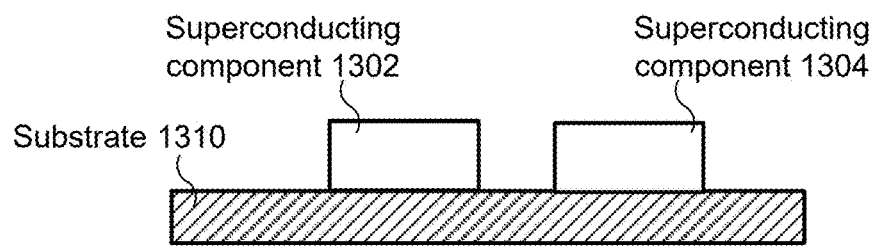
Figure 13C:
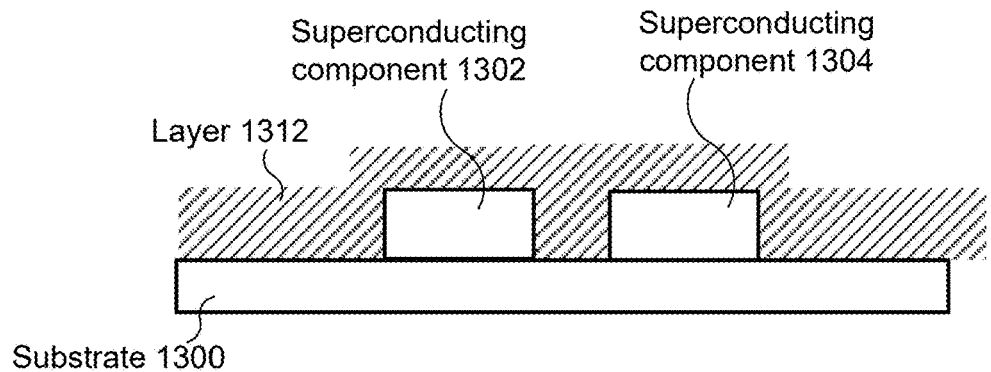

FIGS. 13A-13C illustrate components of a representative circuit in accordance with some embodiments. FIG. 13A shows superconducting components 1302 and 1304 on a substrate 1300 (e.g., a silicon substrate). FIG. 13A also shows a coupling component 1308 (e.g., an electrically-insulating, thermally-conductive component) between the superconducting component 1302 and the superconducting component 1304. FIG. 13B shows the superconducting components 1302 and 1304 on the substrate 1310 (e.g., a substrate composed of an electrically-insulating, thermally-conductive material). FIG. 13C shows the superconducting components 1302 and 1304 on the substrate 1300. FIG. 13C further shows a layer 1312 (e.g., a layer composed of an electrically-insulating, thermally-conductive material) over the substrate 1300 and the superconducting components 1302 and 1304.

Figure 14:
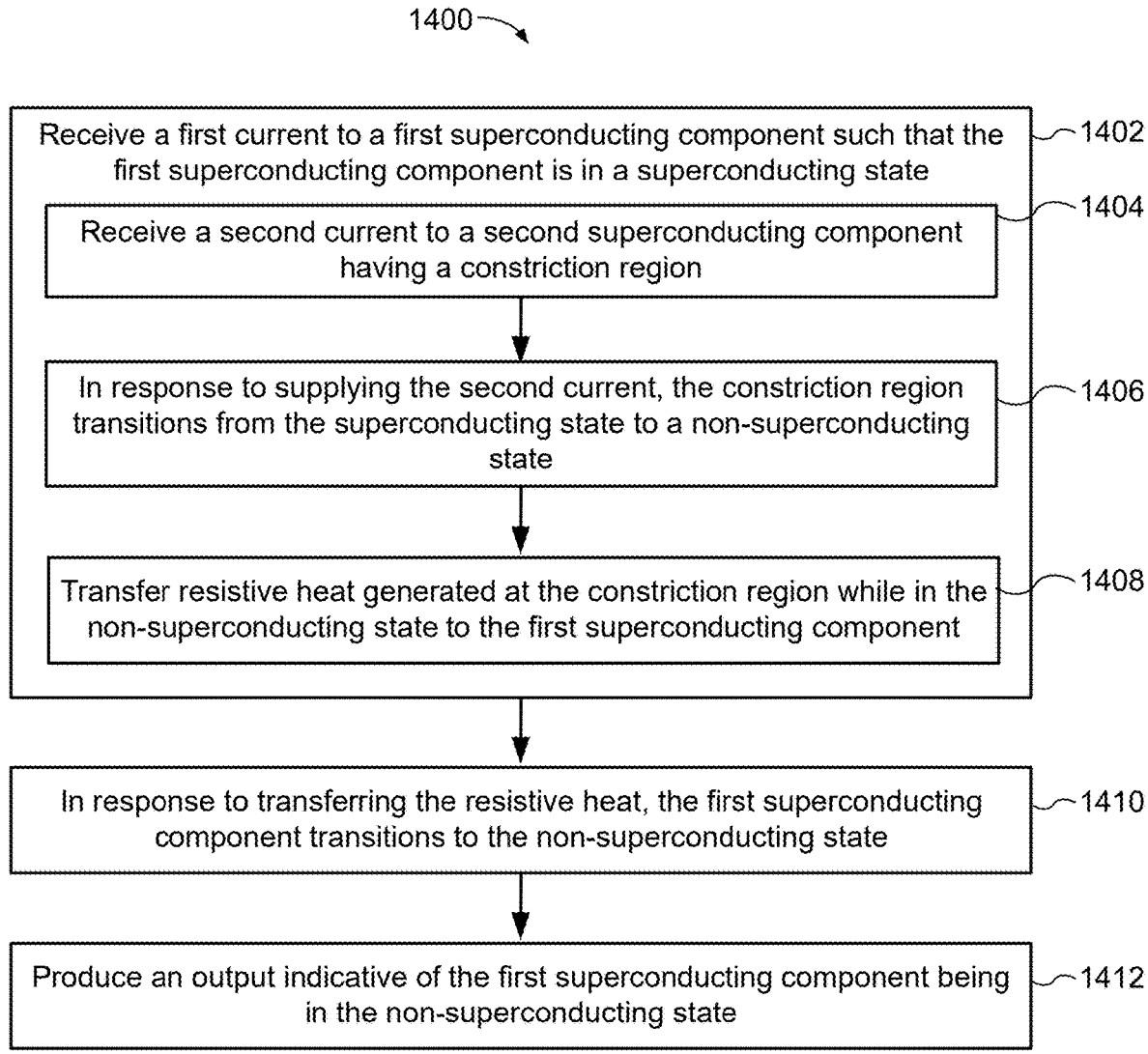
FIG. 14 is a flow diagram illustrating a representative method of operating an impedance multiplication circuit in accordance with some embodiments.

FIG. 14 is a flow diagram illustrating a method 1400 of operating an impedance multiplication circuit in accordance with some embodiments. In some embodiments, the method 1400 is performed by a superconducting circuit, such as circuit including one or more of the circuits 100, 120, 300, 500, 700, 900, 909, and 1100.

The circuit receives (1402) a first current at a first superconducting component such that the first superconducting component is in a superconducting state. The circuit receives (1404) a second current at a second superconducting component having a constriction region. For example, FIGS. 6A-6D illustrate receiving the currents 602 and 604 at superconducting components 102 and 502.

In response to receiving the second current, the constriction region transitions (1406) from the superconducting state to a non-superconducting state. Resistive heat generated at the constriction region is transferred (1408) to the first superconducting component. In some embodiments, the resistive heat is generated while the constriction region is in the non-superconducting state. In response to transferring the resistive heat, the first superconducting component transitions (1410) to the non-superconducting state. The circuit produces (1412) an output indicative of the first superconducting component being in the non-superconducting state. For example, an impedance of the circuit and/or a voltage drop across the circuit corresponds to the first superconducting component being in the non-superconducting state. FIGS. 6A-6D illustrate transitioning constriction region 104 of superconducting component 102 to a non-superconducting state and transferring heat generated at the constriction region 104 to superconducting component 502, thereby transitioning portion 608 of superconducting component 502 to the non-superconducting state.

In some embodiments, the second current is less than the first current. For example, in accordance with some embodiments, the current 602 is less than the current 604 in FIG. 6A.

In some embodiments, the resistive heat is transferred via an electrically-insulating, thermally-conductive component positioned between the first superconducting component and the second superconducting component. For example, the heat is transferred via layer 1312 shown in FIG. 13C.

In some embodiments, while in non-superconducting states, the first superconducting component has a first impedance and the second superconducting component has a second impedance that is less than the first impedance.

Figure 15:
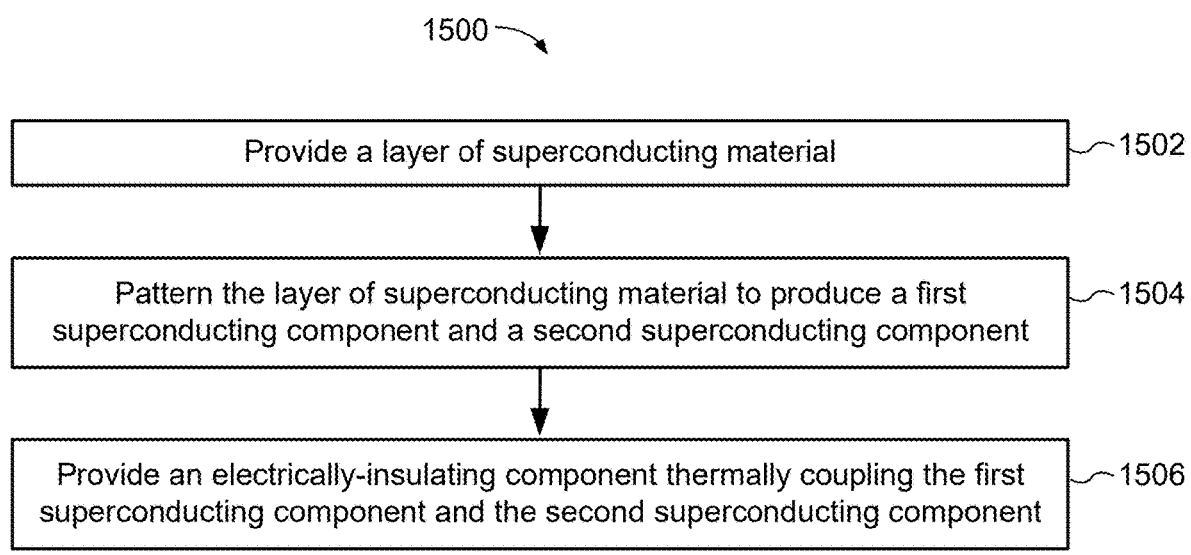
FIG. 15 is a flow diagram illustrating a representative method of fabricating an impedance multiplication circuit in accordance with some embodiments.

FIG. 15 is a flow diagram illustrating a method 1500 of fabricating an impedance multiplication circuit in accordance with some embodiments. In accordance with some embodiments, a method of fabricating a superconducting device includes: (1) providing (1502) a layer (e.g., a thin film) of superconducting material; (2) patterning (1504) the layer to produce a first superconducting component (e.g., superconducting component 1302, FIG. 13A) and a second superconducting component (e.g., superconducting component 1304); and (3) providing (1506) an electrically-insulating component (e.g., coupling component 1308) thermally coupling the first superconducting component and the second superconducting component. In some embodiments, producing the second superconducting component includes producing a constriction region adjacent to the electrically-insulating component. In some embodiments, the constriction region is produced after producing the second superconducting component (e.g., by etching the second superconducting component).

In some embodiments, providing the electrically-insulating component includes patterning the layer to include the electrically-insulating component and oxidizing the electrically-insulating component to decrease electric conductivity of the electrically-insulating component.

In some embodiments, providing the electrically-insulating component includes: (1) providing a second layer of thermally-conductive material; and (2) oxidizing the second layer to decrease electric conductivity of the electrically-insulating component. In some embodiments, providing the electrically-insulating component includes providing a thermally-conductive, electrically-insulating material (e.g., layer 1312, FIG. 13C) coupling the first superconducting component and the second superconducting component. For example, providing the electrically-insulating component includes depositing a thermally-conductive layer of aluminum nitride (AlN) or diamond between the thin film and the substrate and/or on the thin film. As another example, providing the electrically-insulating component includes depositing the thin film on an electrically-insulating, thermally-conductive substrate (e.g., substrate 1310, FIG. 13B).

Figure 16A:
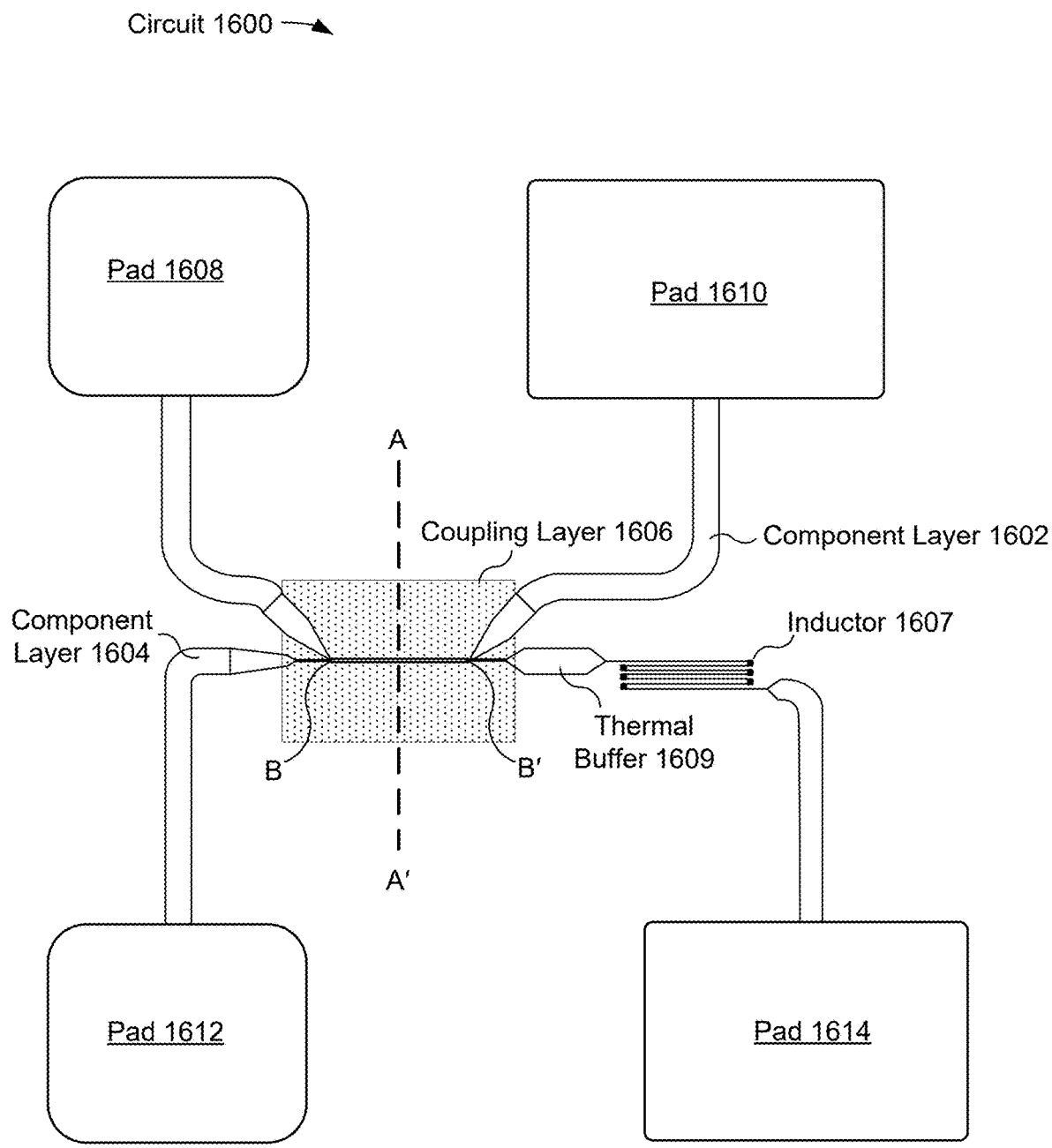
FIGS. 16A-16C illustrate components of a representative circuit in accordance with some embodiments.
Figure 16B:
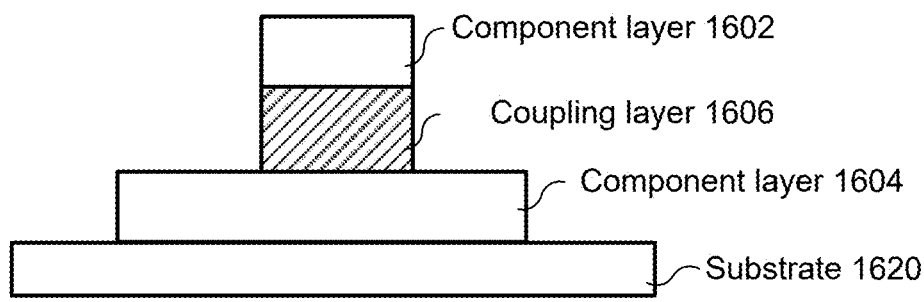
Figure 16C:
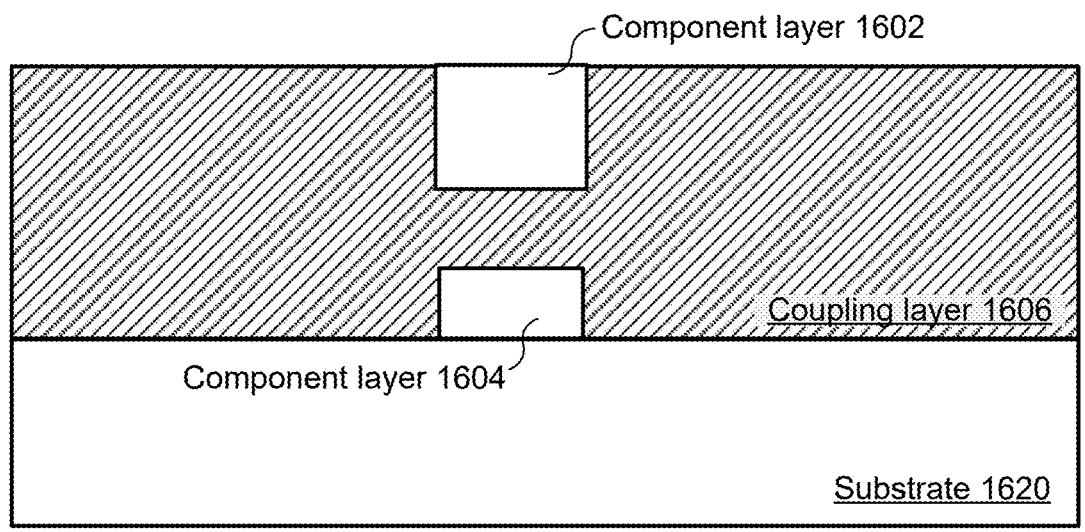

FIGS. 16A-16C illustrate components of a representative circuit in accordance with some embodiments. FIG. 16A shows circuit 1600 (e.g., functionally similar to circuit 150 in FIG. 1C) including component layers 1602 and 1604 and coupling layer 1606. Component layer 1602 includes one or more superconducting, conducting, and/or semiconducting components. In some embodiments, component layer 1602 includes a component that generates heat as current is passed through it (e.g., a resistor). In accordance with some embodiments, component layer 1602 (e.g., an uppermost layer) includes superconducting component 102 and terminals 106 and 108 (see FIG. 1A, not shown in FIG. 16A, but coupled to pads 1608 and 1610 respectively). Component layer 1604 includes one or more superconducting, conducting, and/or semiconducting components. In accordance with some embodiments, component layer 1604 (e.g., a lower layer than component layer 1602) includes superconducting component 112 and terminals 114 and 116 (see FIG. 1A, not shown in FIG. 16A, but coupled to pads 1612 and 1614 respectively). Coupling layer 1606 is positioned between, and thermally couples, component layers 1602 and 1604. In various embodiments, coupling layer 1606 is thermally conductive, electrically insulating, and/or comprises a passivity layer adapted to inhibit oxidation of component layer 1604. In accordance with some embodiments, coupling layer 1606 includes coupling component 110 (see FIG. 1A). In some embodiments, the coupling layer 1606 is composed of silicon dioxide. In some embodiments, the coupling layer 1606 has a thickness between 30 nm and 100 nm.

FIG. 16A also shows inductor 1607 and thermal buffer 1609 on component layer 1604. In accordance with some embodiments, thermal buffer 1609 is positioned and sized so as to provide passive cooling to inductor 1607, by preventing heat from the overlap region between points B and B' from spreading to inductor 1607. In some embodiments, thermal buffer 1609 is a wider superconducting section connected at the end of a narrower superconducting section. In some embodiments, the width of thermal buffer 1609 is at least five times the width of the narrower superconducting section to limit and/or stop the growth of a hotspot. For example, thermal buffer 1609 is sized and positioned to limit growth of a hotspot that forms between points B and B', and to prevent it from spreading into inductor 1607.

In accordance with some embodiments, inductor 1607 is positioned and sized to prevent latch-up of other superconducting components on component layer 1604. For example, inductor 1607 is coupled to component 112 (see FIG. 1C) and operates as described above with respect to component 156 and FIG. 1C. In some embodiments, inductor 1607 is adapted to have an inductance value of at least 50 nano-Henry (nH). In some embodiments, inductor 1607 is adapted to (e.g., sized to) prevent latching of a superconductor component between points B and B', and allow for a self-reset behavior of the superconductor component when the superconductor component current-biased close to its threshold superconducting current.

In some embodiments, component layer 1604 includes a superconducting wire between points B and B' (e.g., component 112, FIG. 1C). In some embodiments, the superconducting wire is composed of niobium nitride (NbN). In some embodiments, the superconducting wire has a width of at least 150 nanometers (nm) to prevent the wire from being photosensitive while current-biased. In some embodiments, the superconducting wire has a width of at most 1000 nm to keep switching power dissipation below 1 microWatt ($\mu$W). In some embodiments, the superconducting wire has a width between 150 nm and 1000 nm.

In some embodiments, component layer 1602 includes a superconducting wire between points B and B' (e.g., component 102, FIG. 1C). In some embodiments, the superconducting wire on component layer 1602 is 2 to 10 times wider than the superconducting wire on component layer 1604 (e.g., to promote heat transfer from the component layer 1602 to the component layer 1604). In some embodiments, the width of the superconducting wire on component layer 1602 is between 300 nm and 10 micron ($\mu$m).

In some embodiments, component layers 1602 and 1604 each optionally include a plurality of sub-layers. In some embodiments, the sub-layers include one or more of: a seed sub-layer (e.g., aluminum nitride (AlN)), a superconducting sub-layer (e.g., NbN), a cap sub-layer (e.g., amorphous silicon), and/or a protective sub-layer (e.g., amorphous silicon). In some embodiments, the seed sub-layer has a thickness between 1 nm and 10 nm. In some embodiments, the superconducting sub-layer has a thickness between 3 nm and 20 nm. In some embodiments, the cap sub-layer has a thickness between 1 nm and 5 nm and is deposited in-situ. In some embodiments, the protective sub-layer has a thickness between 3 nm and 20 nm. In some embodiments, during manufacture, the superconducting sub-layer is etched leaving side-wall portions of the superconducting sub-layer exposed, and the protective sub-layer is then added (e.g., deposited) to protect the side-walls of the superconducting sub-layer from oxidation and/or processing damage from subsequent manufacturing steps. In some embodiments, coupling layer 1606 is deposited over the protective sub-layer.

In some embodiments, component layer 1602 is composed of a material that operates in a non-superconducting state at the desired operating temperature of the circuit 1600. For example, component layer 1602 includes a conducting sub-layer (e.g., composed of titanium (Ti) and/or tungsten (W)). In some embodiments, the conducting sub-layer has a thickness between 10 nm and 100 nm.

FIG. 16A shows overlap of components on component layers 1602 and 1604 only between points B and B'. Minimizing or preventing overlap of components on component layers 1602 and 1604, as shown in FIG. 16A, allows for directed heat transfer between the layers and reduces unwanted heat transfer between the component layers. FIG. 16A also shows widening of components on component layers 1602 and 1604 beyond points B and B' (e.g., thermal buffer 1609). The widening of components allows for more passive cooling and reduces the impact of heat transfer at locations outside of B and B'. In some embodiments (not shown), the components of component layers 1602 and 1604 taper from the pads to reduce current crowding effects.

FIG. 16B shows a cross-sectional view of circuit 1600 along the A-A' axis shown in FIG. 16A. As shown in FIG. 16B, in some embodiments, component layer 1604 is adjacent to substrate 1620 (e.g., component layer 1604 is deposited on substrate 1620). In some embodiments, one or more additional layers are positioned between substrate 1620 and component layer 1604. Coupling layer 1606 is between component layer 1604 and component layer 1602 (e.g., coupling layer 1606 is deposited on component layer 1604). In some embodiments, coupling layer 1606 comprises one or more sub-layers having different compositions. In some embodiments, component layer 1602 is adjacent to coupling layer 1606 (e.g., component layer 1602 is deposited on coupling layer 1606).

In some embodiments, as shown in FIG. 16C, coupling layer 1606 encompasses more than one side of component layers 1602 and 1604. In some embodiments, coupling layer 1606 is deposited over component layer 1604 (e.g., so as to operate as a protective layer for components on component layer 1604). In some embodiments, a portion of coupling layer 1606 is removed (e.g., is etched away) and component layer 1602 is positioned in place of the removed portion (e.g., component layer 1602 is deposited within the removed portion).

In light of these principles and embodiments, we now turn to certain additional embodiments.

In accordance with some embodiments, an electric circuit includes: (1) a first superconducting component having a first terminal, a second terminal, and a constriction region between the first terminal and the second terminal; (2) a second superconducting component having a third terminal and a fourth terminal; and (3) a first electrically-insulating component that thermally couples the first superconducting component and the second superconducting component such that heat produced at the constriction region is transferred through the first component to the second superconducting component. For example, FIG. 1A shows superconducting component 102 with terminals 106 and 108 and superconducting component 112 with terminals 114 and 116. FIG. 1A further shows coupling component 110 thermally coupling superconducting components 102 and 112.

In some embodiments, the first electrically-insulating component is an electrically-insulating, thermally-conductive connector (e.g., coupling component 1308, FIG. 13A) positioned between the first superconducting component and the second superconducting component (e.g., as shown in FIG. 1A).

In some embodiments: (1) the second superconducting component includes a plurality of regions between the third terminal and the fourth terminal; and (2) the circuit includes a plurality of electrically-insulating components (e.g., components 304, FIG. 3) positioned so as to thermally couple the plurality of regions and facilitate transition of the plurality of regions to the non-superconducting state via heat transfer (e.g., resistive or phononic) through the plurality of regions.

In some embodiments, heat transferred by the plurality of electrically-insulating components increase an impedance of the second superconducting device while the second superconducting device is in the non-superconducting state.

In some embodiments, the first electrically-insulating component is an electrically-insulating, thermally-conductive substrate (e.g., substrate 1310, FIG. 13B) on which the first superconducting component and the second superconducting component are positioned.

In some embodiments: (1) the second superconducting component has a first portion (e.g., portion 504, FIG. 5) between the third terminal and the fourth terminal; and (2) the second superconducting component is positioned so that the first portion of the second superconducting component is in proximity with the first superconducting component such that heat produced at the first superconducting component transfers to the first portion. For example, FIGS. 6A-6D illustrate such a heat transfer.

In some embodiments, the first portion is in closer proximity to the first superconducting component than any other portion of the second superconducting component (e.g., in close proximity to the constriction region). For example, FIG. 5 shows portion 504 in closer proximate to superconducting component 102 than any other portion of superconducting component 502.

In some embodiments, the second superconducting component includes, between the third terminal and the fourth terminal, a second portion and a third portion each positioned in proximity to the first portion such that heat produced at the first portion transfers to the second portion and the third portion.

In some embodiments, the circuit further includes: (1) a first current source (e.g., current source 1210, FIG. 12) coupled to the first terminal of the first superconducting component (e.g., superconducting component 102), the first current source configured to supply a first current (e.g., current 202, FIG. 2A) that exceeds a threshold current for the first superconducting component, where: (a) the first current causes the constriction region (e.g., constriction region 104, FIG. 1A) to transition from a superconducting state to a non-superconducting state, and (b), in the non-superconducting state, the constriction region generates heat that is transferred to the second superconducting component via the first electrically-insulating component (e.g., as illustrated in FIGS. 2B-2D); and (2) a second current source (e.g., current source 1218, FIG. 12) coupled to the third terminal of the second superconducting component, the second current source configured to supply a second current (e.g., current 204, FIG. 2A), where a combination of the second current and the heat transferred from the constriction region causes the second superconducting component to transition from the superconducting state to the non-superconducting state.

In some embodiments, while in the non-superconducting state, the first superconducting component has a first impedance and the second superconducting component has a second impedance that is greater than the first impedance.

In some embodiments, first superconducting component and the second superconducting component are positioned so as to inhibit (e.g., prevent) cooper pair and/or electron tunneling between the first and second superconducting components (e.g., are 10 nm, 1000 nm, or more apart).

In some embodiments, the circuit further includes: (1) a photon detection component (e.g., photodetector 1212, FIG. 12) coupled, via one or more resistors (e.g., resistor(s) 1204), to the first terminal of the first superconducting component, the photon detector component configured to output a first current to the first superconducting component upon detection of a threshold number of photons; and (2) an output component (e.g., readout circuit 1216) coupled to the fourth terminal of the second superconducting component, the output component configured to be responsive to a voltage drop across the second superconducting component; where the first current exceeds a current threshold of the first superconducting component, thereby transitioning the constriction region to a non-superconducting state; and where the voltage drop is responsive to the second superconducting component transitioning to the non-superconducting state.

In accordance with some embodiments, an electric circuit includes a first superconducting component (e.g., component 910, FIG. 9B) comprising: (1) a first terminal (e.g., terminal 912); (2) a second terminal (e.g., terminal 914); (3) a first portion between the first terminal and the second terminal (e.g., region 916), the first portion having a first superconducting current threshold; and (4) a second portion between the first terminal and the second terminal (e.g., region 918), the second portion having a second superconducting current threshold, less than the first superconducting current threshold; where the first portion is positioned in proximity to the second portion such that resistive heat from the second portion is transferred to the first portion (e.g., as illustrated in FIGS. 10A-10D).

In some embodiments: (1) the circuit further includes a current source (e.g., current source 920, FIGS. 9A and 10A) coupled to the first terminal of the first superconducting device, the current source configured to supply a first current (e.g., current 1002, FIG. 10A) that is less than the first superconducting current threshold and greater than the second superconducting current threshold; (2), responsive to the first current, the second portion is configured to transition from a superconducting state to a non-superconducting state; and (3), responsive to a combination of the first current and the resistive heat from the second portion, the first portion is configured to transition from the superconducting state to the non-superconducting state.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

As used herein, a "superconducting circuit" or "superconductor circuit" is a circuit having one or more superconducting materials. For example, a superconductor switch circuit is a switch circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also sometimes called herein a superconduction-capable material. In some embodiments, the superconducting materials operate in an "off" state where little or no current is present. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance. As an example, superconducting layer 118 is a layer that is capable of operating in a superconducting state (e.g., under particular operating conditions).

As used herein, a "wire" is a section of material configured for transferring electrical current. In some embodiments, a wire includes a section of material conditionally capable of transferring electrical current. For example, a wire made of a superconducting material that is capable of transferring electrical current while the wire is maintained at a temperature below a threshold temperature. As another example, a wire made of semiconducting material is capable of transferring electrical current while the wire is maintained at a temperature above a freeze-out temperature. A cross-section of a wire (e.g., a cross-section that is perpendicular to a length of the wire) optionally has a regular (e.g., flat or round) shape or an irregular shape. While some of the figures show wires having rectangular shapes, any shape could be used. In some embodiments, a length of a wire is greater than a width or a thickness of the wire (e.g., the length of a wire is at least 5, 6, 7, 8, 9, or 10 times greater than the width and the thickness of the wire). In some cases, a wire is a section of a superconducting layer.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electric circuit, comprising:
   a superconducting component having a first terminal and a second terminal, the superconducting component including a first portion, a second portion, and a third portion electrically connecting the first portion with the second portion;
   an electrically-insulating component that thermally couples the first portion with the second portion such that heat produced in response to the first portion transitioning to a non-superconducting state is transferred through the electrically-insulating component to the second portion;

an input component coupled to the first portion, the input component configured to supply an input to the first portion; and an output component coupled to the second terminal of the superconducting component, the output component configured to be responsive to a voltage drop across the superconducting component.

2. The electric circuit of claim 1, wherein the electrically-insulating component is an electrically-insulating, thermally-conductive connector positioned between the first portion and the second portion.

3. The electric circuit of claim 1, wherein the electrically-insulating component is an electrically-insulating, thermally-conductive substrate on which the superconducting component is positioned.

4. The electric circuit of claim 1, wherein:
an input from the input component causes the first portion to transition from the superconducting state to the non-superconducting state; and
in the non-superconducting state, the first portion generates heat that is transferred to the second portion via the electrically-insulating component.

5. The electric circuit of claim 4, wherein the heat transferred from the first portion causes the second portion to transition from the superconducting state to the non-superconducting state.

6. The electric circuit of claim 1, further comprising a current source coupled to the first terminal of the superconducting component, the current source configured to supply a current to the superconducting component.

7. The electric circuit of claim 1, wherein, while in the non-superconducting state, the first portion has a first impedance and the second portion has a second impedance that is greater than the first impedance.

8. The electric circuit of claim 1, wherein the first portion and the second portion are positioned so as to inhibit cooper pair and/or electron tunneling between the first and second portions.

9. The electric circuit of claim 1, wherein the input component is coupled to the first terminal.

10. The electric circuit of claim 1, wherein the input from the input component comprises a current that exceeds a superconducting current threshold of the first portion.

11. The electric circuit of claim 1, wherein the third portion has a width that is wider than the first portion, and the third portion is wider than the second portion.

12. The electric circuit of claim 1, wherein the superconducting component is composed of a thin film of superconducting material.

13. The electric circuit of claim 1, wherein the electrically-insulating component is composed of a superconducting material.

14. The electric circuit of claim 1, wherein the electrically-insulating component is composed of a dielectric material.

15. The electric circuit of claim 1, wherein the electrically-insulating component is composed of a same material as the superconducting component.

16. The electric circuit of claim 1, wherein the input component comprises a photon detector configured to supply the input to the first portion upon detection of a threshold number of photons.

17. The electric circuit of claim 16, wherein the photon detector is a superconducting nanowire single photon detector.

18. The electric circuit of claim 16, wherein the photon detector is voltage biased.

19. The electric circuit of claim 1, wherein:
the superconducting component further includes:
a fourth portion electrically connected to the second portion at a first end; and
a fifth portion electrically connected to the fourth portion at a second end of the fourth portion, opposite the first end; and
the electric circuit further includes a second electrically-insulating component that thermally couples the fifth portion with the second portion.

20. The electric circuit of claim 1, wherein the superconducting component is composed of niobium.

* * * * *